United States Patent
Osaka et al.

(10) Patent No.: US 6,658,321 B2
(45) Date of Patent: Dec. 2, 2003

(54) SUBSTRATE PROCESSING METHOD AND APPARATUS

(75) Inventors: Akihiro Osaka, Tokyo (JP); Masaki Murobayashi, Tokyo (JP); Tatsuhisa Matsunaga, Tokyo (JP); Kouichi Noto, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 120 days.

(21) Appl. No.: 09/956,820

(22) Filed: Sep. 21, 2001

(65) Prior Publication Data

US 2002/0038164 A1 Mar. 28, 2002

(30) Foreign Application Priority Data

Sep. 25, 2000 (JP) ......................................... 2000-290020

(51) Int. Cl.[7] ................................................. G06F 7/00
(52) U.S. Cl. ....................................................... 700/218
(58) Field of Search ................................. 700/213, 214, 700/218; 414/935, 936, 937, 938, 939, 941

(56) References Cited

U.S. PATENT DOCUMENTS

| 4,775,281 | A | * | 10/1988 | Prentakis | 414/416.03 |
| 6,052,913 | A | * | 4/2000 | Kaneko et al. | 33/645 |
| 6,203,268 | B1 | * | 3/2001 | Miyashita | 414/757 |
| 6,247,245 | B1 | * | 6/2001 | Ishii | 34/82 |
| 6,368,049 | B1 | * | 4/2002 | Osaka et al. | 414/783 |
| 2001/0052392 | A1 | | 12/2001 | Nakamura et al. | |

FOREIGN PATENT DOCUMENTS

| JP | A 6-140492 | 5/1994 |
| JP | A 6-334026 | 12/1994 |
| TW | 403950 | 9/2000 |

* cited by examiner

Primary Examiner—Khoi H. Tran
(74) Attorney, Agent, or Firm—Oliff & Berridge, PLC

(57) ABSTRACT

Substrate positioning and substrate transporting are processed in parallel, thereby reducing substrate transfer apparatus wait time and improving substrate processing throughput. A substrate transfer apparatus 1 is configured in a single unit, a plural number of wafers W prior to notch alignment is transported at one time from a substrate accommodating container to a substrate alignment apparatus 22, and the plural number of notch aligned wafers is transported from the substrate alignment apparatus 22 to a boat 21. Two stages (upper and lower) of notch alignment units 4 and 5 that configure the substrate alignment apparatus 22 operate independently, and are capable of performing notch alignment, in total, on a number of wafers to be processed that is twice the number of wafers transported at one time by the substrate transfer apparatus 1. While notch alignment is being performed in the one notch alignment unit 4, notch aligned wafers W are transported by the substrate transfer apparatus from the other notch alignment unit 5 to the boat 21, and then wafers prior to notch alignment are transported from the substrate accommodating container to the other notch alignment unit 5.

8 Claims, 21 Drawing Sheets

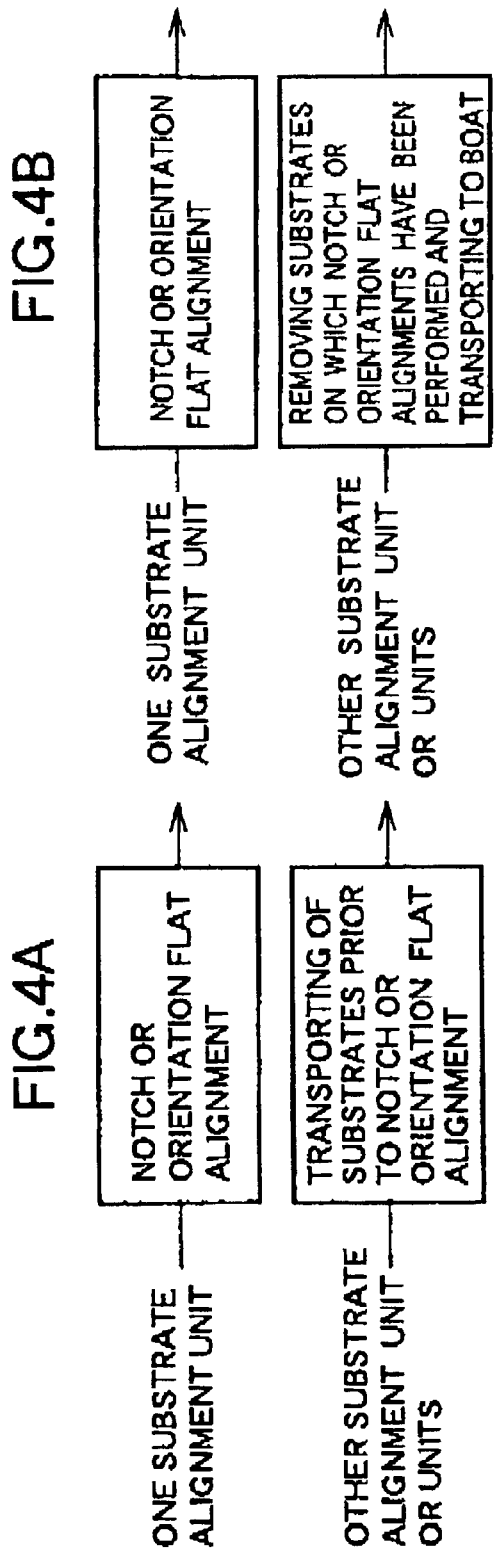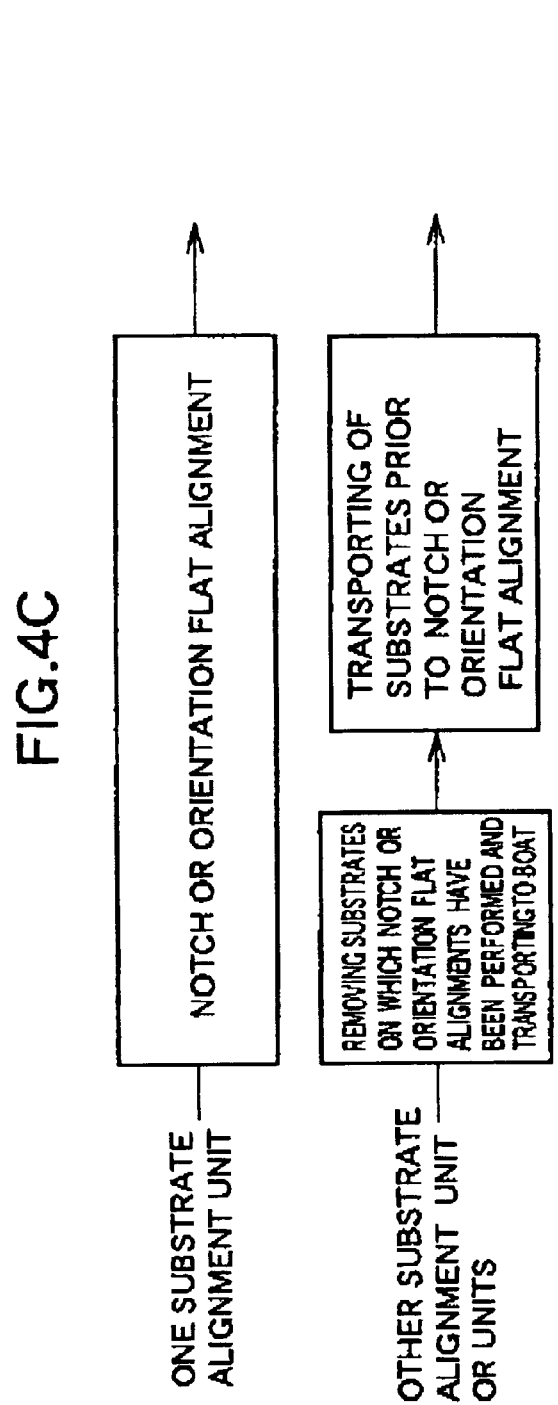

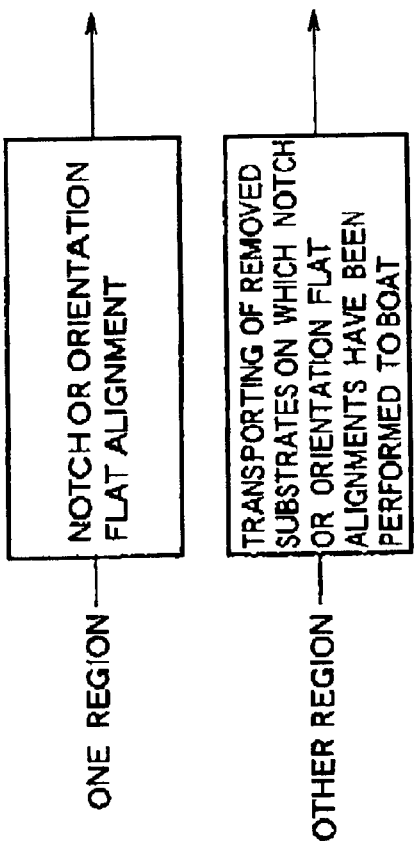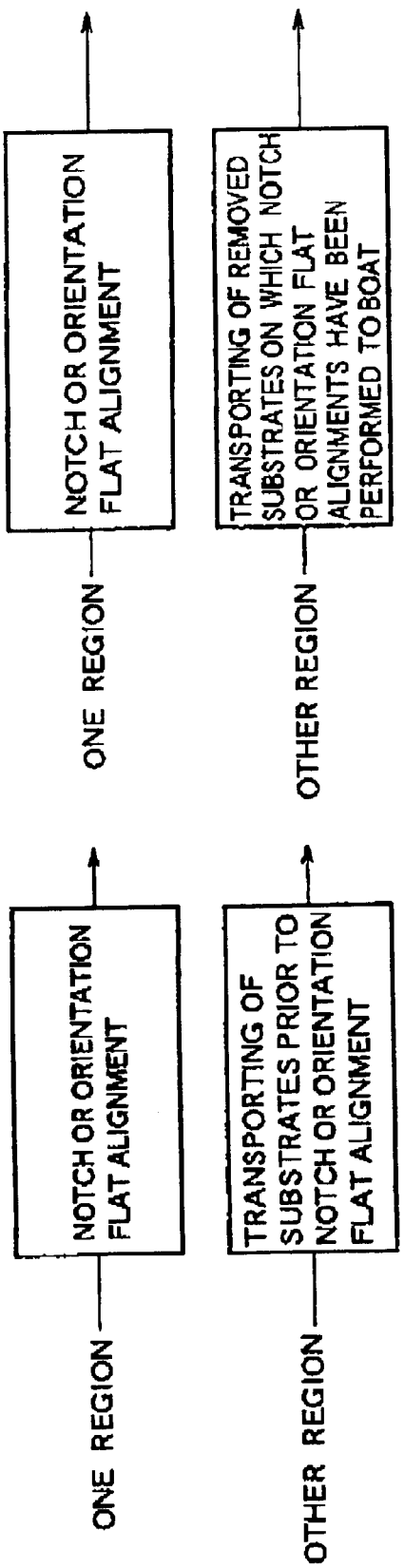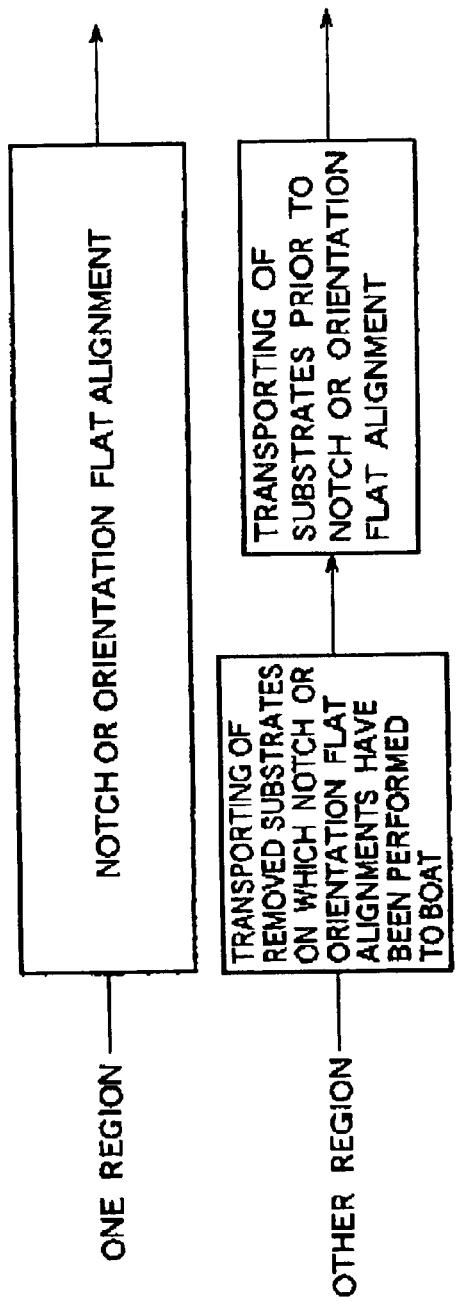

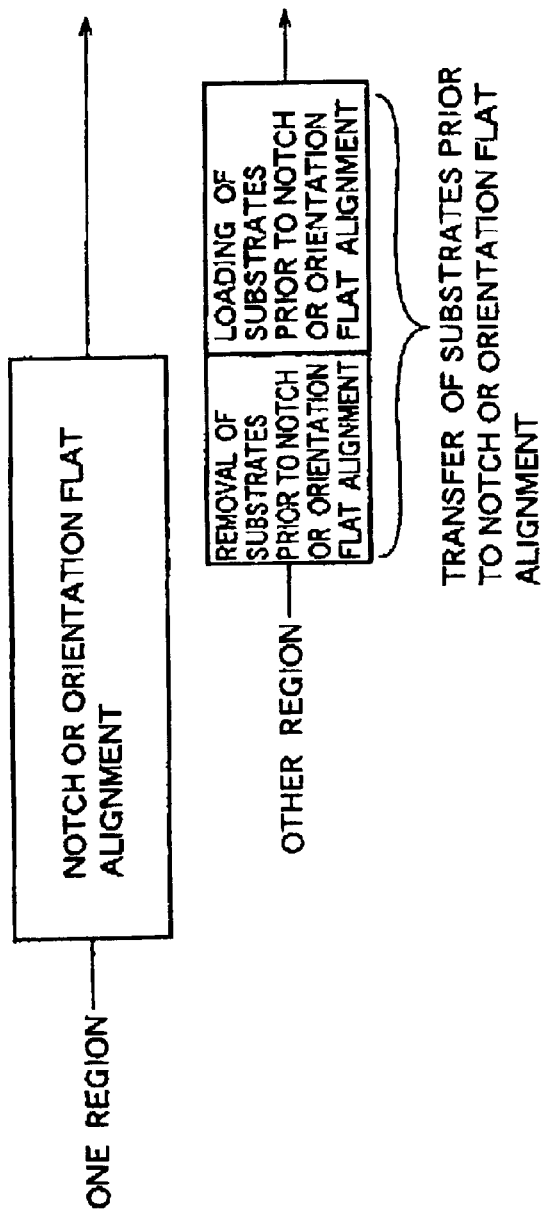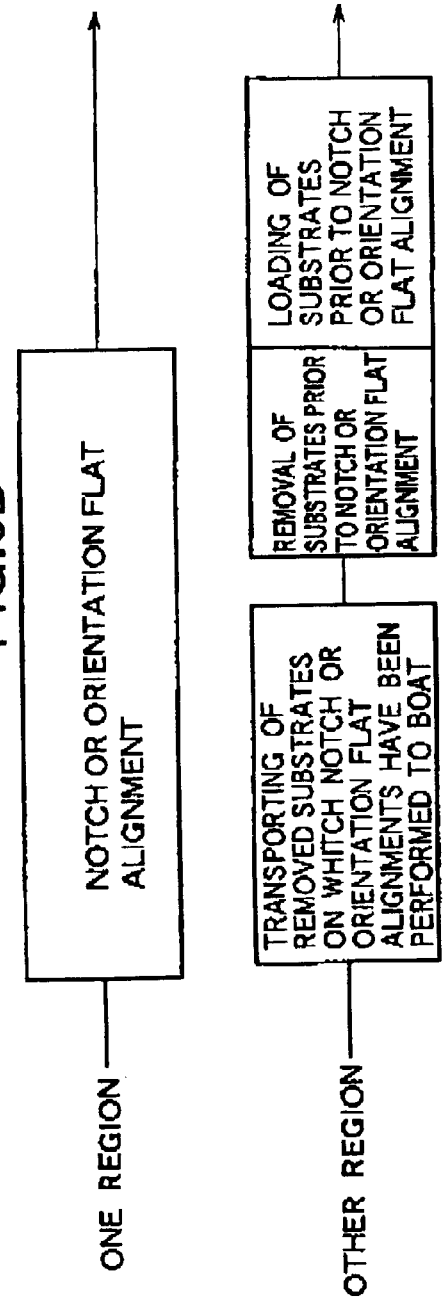

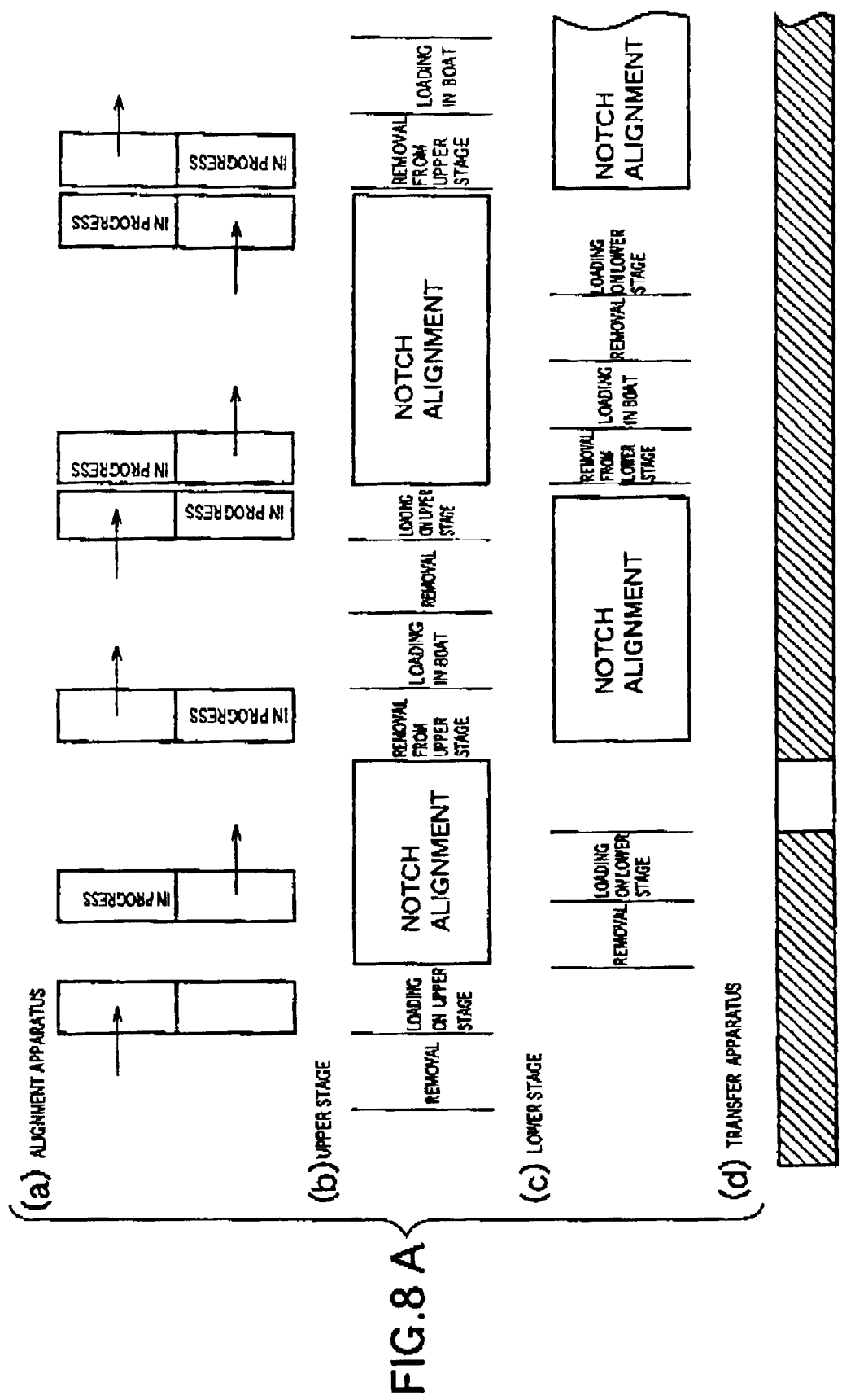

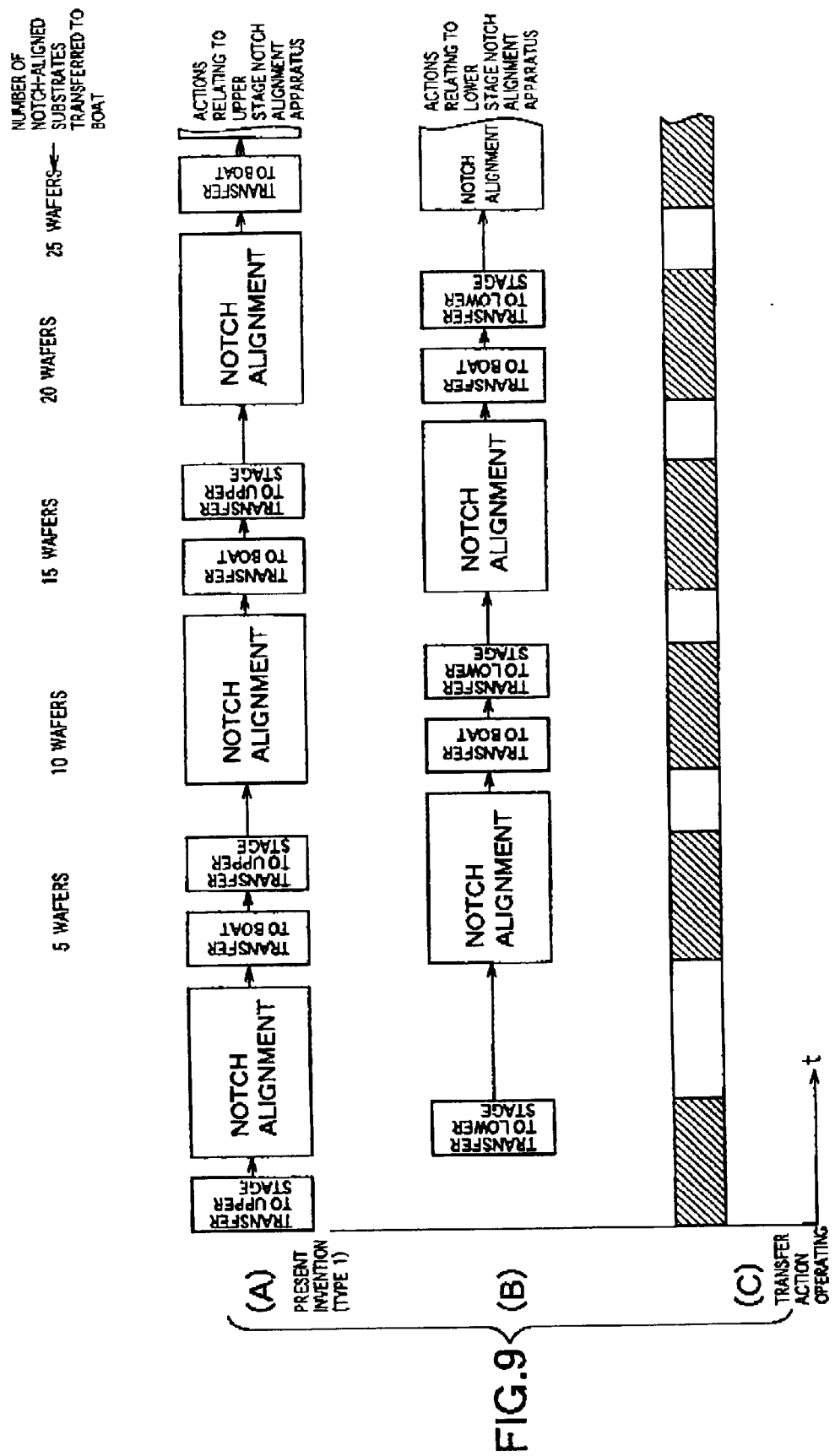

DIRECTION OF WAFER LOADING AND REMOVAL

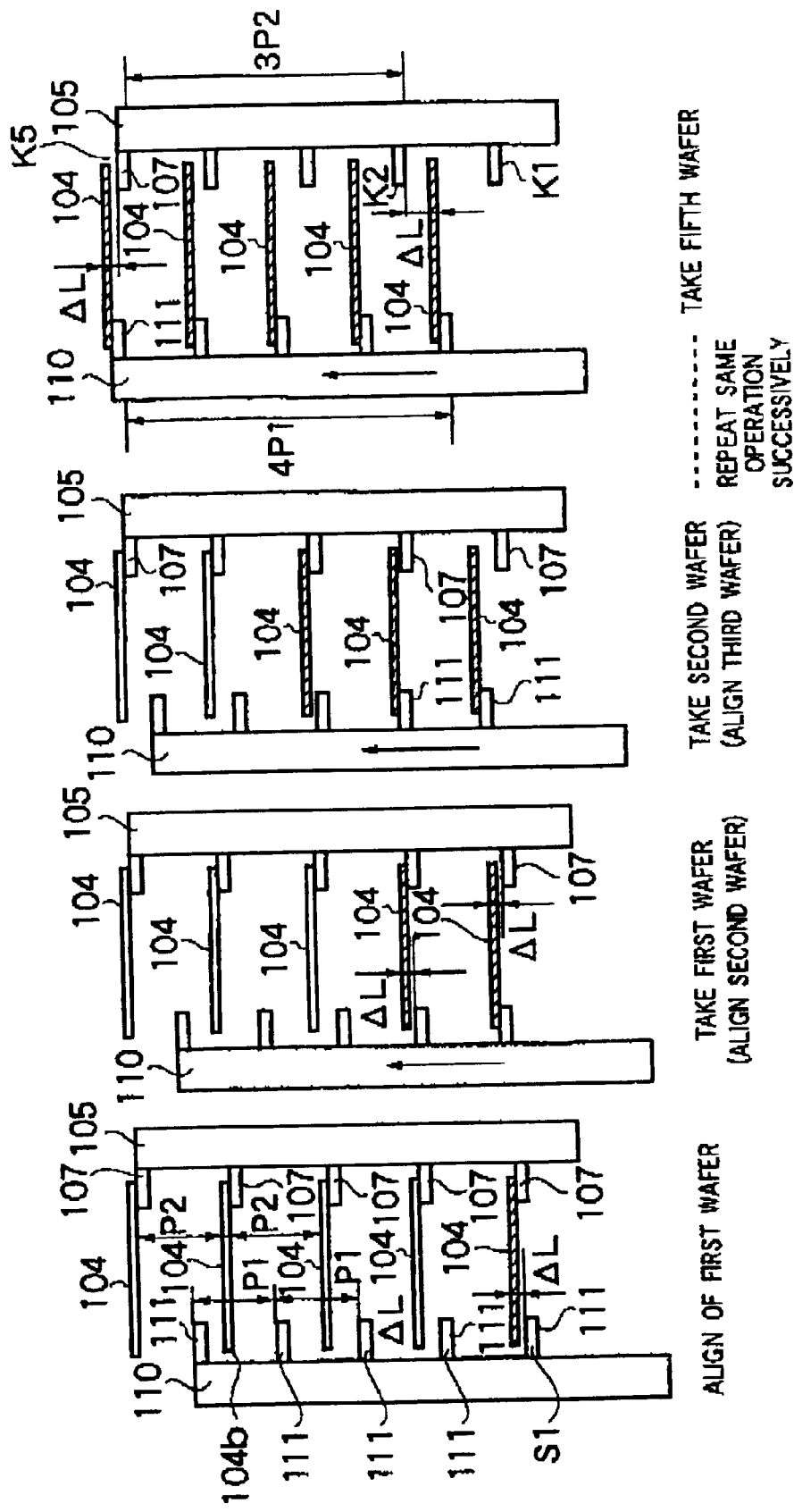

SUBSTRATE PROCESSING METHOD AND APPARATUS

BACKGROUND OF THE INVENTION

1. Field of the Invention

This invention relates to a substrate processing method and apparatus, and particularly to such a method and apparatus well suited for improving the substrate alignment apparatus in an upright dispersion-CVD apparatus and enhancing the efficiency wherewith a substrate transfer apparatus is used

2. Description of the Related Art

In conventional upright dispersion-CVD apparatuses, when wafers inside a pod that is a substrate accommodating vessel are supplied to a boat, the notches of the wafers accommodated in the pod are not lined up, wherefore the notches are aligned with a notch alignment apparatus, and those aligned wafers are supplied to the boat. That is, the wafers in the pod, after the door of the pod is opened by a pod opener, are moved from the inside the pod and loaded into the notch alignment apparatus, by one wafer transfer device. The wafers that have been notch-aligned are moved and loaded into the boat from the notch alignment apparatus by the wafer transfer device. Then the boat is loaded into the reaction oven and a processing treatment is performed.

For example, the wafers in the pod are contained therein in 25-wafer units, and the wafer transfer device is normally made so as to be able to transport wafers in 5-wafer units at one time. Thus the notch alignment apparatus is also made so as to be able to perform notch alignment in 5-wafer units, and only one notch alignment apparatus that carries 5 wafers is incorporated, as a unit, in the upright dispersion-CVD apparatus. Because the configuration is as described here, the wafer moving and loading flow from the pod opener to the boat is such that 5 wafers are moved and loaded at one time into the notch alignment apparatus, the 5 wafers are notch-aligned simultaneously in the notch alignment apparatus, and, after that, the five notch-aligned wafers are transferred to the boat. This action is successively repeated until the requisite number of wafers—say 100 to 150 wafers, for example—is transferred to the boat.

In a conventional substrate processing apparatus, as described in the foregoing, a single substrate transfer apparatus and a substrate alignment apparatus capable of performing substrate alignment processing on the same number of substrate as can be moved and loaded are used, the substrates are successively transferred to the substrate alignment apparatus by the substrate transfer apparatus, and alignment processing is performed. The result is a serial process wherein there is a waiting period until the alignment process has finished and then the next substrates are transferred to the substrate alignment apparatus and positioning is performed. For that reason, the substrate transfer apparatus waiting time is long, and substrate processing throughput does not improve.

SUMMARY OF THE INVENTION

An object of the present invention is to provide a substrate processing method and apparatus wherewith, by raising the processing volume of the substrate alignment apparatus, the problems with the prior art noted in the foregoing are resolved, the substrate transfer apparatus waiting time can be reduced, and the throughput of the substrate process can be improved.

The substrate processing method described in claim 1 is a substrate processing method, comprising: providing a single substrate transfer apparatus and a substrate alignment apparatus, the substrate transfer apparatus being either for transporting at one time a plural number of substrates prior to notch or orientation flat alignment from a substrate accommodating container to the substrate alignment apparatus, or for transporting a plural number of substrates on which notch or orientation flat alignment has been performed from the substrate alignment apparatus to a boat, the substrate alignment apparatus being capable of performing notch or orientation flat alignment on a number of substrates that is twice or more of the number of substrates which the substrate transfer apparatus transports at one time; and setting a number of substrates on which notch or orientation flat alignment is performed at one time with the substrate alignment apparatus to the number of substrates which the substrate transfer apparatus transports at one time, the set number is fewer than the number of substrates on which the substrate alignment apparatus is capable of performing notch or orientation flat alignment; the method being designed so as to perform, in parallel: the notch or orientation flat alignment on substrates with the substrate alignment apparatus wherein the number of substrates on which the notch or orientation flat alignment is performed at one time is set in such a way: and either the transporting of substrates by the single substrate transfer apparatus prior to the notch or orientation flat alignment from the substrate accommodating container to the substrate alignment apparatus, or the transporting of substrates on which the notch or orientation flat alignment has been performed from the substrate alignment apparatus to the boat.

Transporting, as used here, has a broad meaning that includes, in addition to moving and loading, that is, the operation of moving substrates from one location to another location and loading them, substrate removal, from a substrate loading location, simple transporting that simply moves substrates to another location, and the operation of loading the substrates moved to another location at that location, etc that are respectively one of series of actions necessary in moving substrates to another location. The term "in parallel," moreover, is used in a broad sense that includes both cases where the two parallel operations at issue chronologically overlap and cases where they do not so overlap, where such overlapping also includes cases of partial overlapping.

In the substrate processing method of claim 1, three methods are comprehended, as diagrammed in FIGS. 3A, 3B and 3C. The first method is a method wherewith the transporting of substrates prior to notch or orientation flat alignment from a substrate accommodating container to a substrate alignment apparatus is performed in parallel with the operation of notch or orientation flat alignment (cf. FIG. 3A). The second method is a method wherewith the transporting of substrates on which notch or orientation flat alignment have been performed from the substrate alignment apparatus to the boat is performed in parallel with notch or orientation flat alignment (cf. FIG. 3B). And the third method is a method wherewith the transporting of substrates prior to notch or orientation flat alignment from the substrate accommodating container to the substrate alignment apparatus, the transporting of the substrates on which notch or orientation flat alignment has been performed from the substrate alignment apparatus to the boat, and the notch and orientation flat alignments are performed in parallel (of. FIG. 3C).

In order to make it possible for the substrate alignment apparatus to perform notch or orientation flat alignment on a number of substrates that is twice or more than the number of substrates that are transported at one time by one substrate transfer apparatus, the portion that performs the notch or orientation flat alignment of the substrate alignment apparatus is configured of a plurality of portions that act mutually independently, making provision so that the total number of notch or orientation flat alignments performed by that plurality of portions is a number for which it is possible to perform the substrate notch or orientation flat alignment. Alternatively, the problem can be dealt with merely by simply establishing more portions that perform the notch or orientation flat alignment of the substrate alignment apparatus. In the latter case, the increased portions will exhibit dependent action with the portions prior to the increase, and independent action cannot be effected. By independent action here is meant that, even when a plurality of portions is operated independently, there is no mutual interference between the plurality of portions, while dependent action means that interference does occur. Accordingly, with independent action, even if one portion of a plurality of portions is currently operating, substrates can be moved and loaded into other portions, whereas that cannot be done in the case of dependent action.

As in the present invention, the number of substrates on which notch or orientation flat alignments are performed at one time by the substrate alignment apparatus is set to the number of substrates that are transported at one time by one substrate transfer apparatus, that being a number that is smaller than the maximum number on which notch or orientation flat alignment can be performed by the substrate alignment apparatus (i.e. a number twice or more than the number of substrates that are transported at one time by the substrate transfer apparatus). Therefore, openings occur in the substrate alignment apparatus during the notch or orientation flat alignment of substrates. To the portion or portions where such openings have occurred, substrates that have yet to be subjected to notch or orientation flat alignment can be transported, within such range as that the notch or orientation flat alignment operation is not interfered with. Accordingly, the substrate transfer apparatus waiting time will be reduced, and the number of substrates positioned during a prescribed time for the number of substrates on which notch or orientation flat alignments are performed can be increased. As a result, the substrate transfer apparatus utilization efficiency is improved, and the substrate processing throughput is improved.

The substrate processing method described in claim 2 is a substrate processing method, comprising: providing a single substrate transfer apparatus and a plural number of independently operating substrate alignment units, the substrate transfer apparatus being either for transferring at one time a plural number of substrates prior to notch or orientation flat alignment, from a substrate accommodating container to the substrate alignment units, or for transferring a plural number of substrates on which notch or orientation flat alignment has been performed from the substrate alignment units to a boat, the substrate alignment units being capable of performing notch or orientation flat alignment, in total, on a number of substrates that is twice or more of the number of substrates which the substrate transfer apparatus transports at one time; the method being designed such that, in parallel with performing the notch or orientation flat alignment on the substrates with one of the substrate alignment units, using the substrate transfer apparatus, substrates prior to notch or orientation flat alignment are transferred from the substrate accommodating container to other unit or units of the substrate alignment units, or substrates on which notch or orientation flat alignment has been performed with other unit or units of the substrate alignment units are transferred from the other unit or units of the substrate alignment units to the boat.

This substrate processing method comprises three methods, as diagrammed in FIGS. 4A,4B and 4C. The first method is a method wherewith, in parallel with the performing of substrate notch or orientation flat alignment with the one unit of the substrate alignment units, substrates prior to notch or orientation flat alignment are transported to the other unit or units of the substrate alignment units (cf. FIG. 4A). The second method is a method wherewith, in parallel with the performing of substrate notch or orientation flat alignment with the one unit of the substrate alignment units, substrates on which notch or orientation flat alignment have been performed are removed from the other unit or units of the substrate alignment units and transported to the boat (cf. FIG. 4B). And the third method is a method wherewith, in parallel with the performing of substrate notch or orientation flat alignment with the one unit, substrates on which notch or orientation that alignment have been performed are removed from the other unit or units and transported to the boat, and, concurrently therewith, substrates prior to notch or orientation flat alignment are transported to the other unit or units (cf. FIG. 4C).

Because a plurality of independently operating substrate alignment units are provided, while the one unit is performing notch or orientation flat alignment, substrates prior to notch or orientation flat alignment can be transported to currently waiting the other unit or units that is not performing notch or orientation flat alignment, without waiting for the notch or orientation flat alignment to be completed by the one unit. Also, while the one unit is performing notch or orientation flat alignment, the substrates already subjected to notch or orientation flat alignment by the other unit or units can be removed and transported to the boat. Accordingly, substrates can be alternately transferred to two substrate alignment units, notch or orientation flat alignment can be alternately performed, and substrates on which notch or orientation flat alignment has been performed can be alternately removed and can be successively transferred to the boat, wherefore substrate processing throughput is improved.

The substrate processing method described in claim 3, as diagrammed in FIG. 4C, is the substrate processing method according to claim 2, wherein, using the substrate transfer apparatus, after substrates on which notch or orientation flat alignment has been performed with the other unit or units of the substrate alignment units are transferred from the other unit or units of the substrate alignment units to the boat, substrates prior to notch or orientation flat alignment are transferred from the substrate accommodating container to the other unit or units of the substrate alignment units. According to the present invention, the transfer of substrates prior to notch or orientation flat alignment that is the first operation in the processing cycle is performed after the transfer of the substrates on which notch or orientation flat alignment has been performed to the boat, which is the final operation in the processing cycle. Therefore, it becomes possible to use a single substrate transfer apparatus efficiently, and to improve substrate processing throughput.

The substrate processing method described in claim 4 is the substrate processing method according to claim 2, wherein, the notch or orientation flat alignment by the one of the substrate alignment units and the notch or orientation flat alignment by the other unit or units are performed while being allowed to partially overlap. Based on the present invention, the notch or orientation flat alignment by the one of the substrate alignment units and the notch or orientation flat alignment by the other unit or units are performed while being allowed to partially overlap, wherefore it becomes possible to further improve throughput in substrate processing, compared to when these notch or orientation flat alignments are set to be performed without being allowed to overlap.

The substrate processing method described in claim 5 is a substrate processing method, comprising: providing a single substrate transfer apparatus and a substrate alignment apparatus, the substrate transfer apparatus being for transporting at one time a plural number of substrates either from a substrate accommodating container to the substrate alignment apparatus or from the substrate alignment apparatus to a boat, the substrate alignment apparatus having a plurality of dependently operating regions being capable of performing notch or orientation flat alignment, in total, on a number of substrates that is twice or more of the number of substrates which the substrate transfer apparatus transports at one time; the method being designed such that, in parallel with performing the notch or orientation flat alignment on substrates with one of the plurality of regions, using the substrate transfer apparatus, substrates prior to notch or orientation flat alignment are transferred from the substrate accommodating container to other region of the plurality of regions, or substrates, discharged from the other region, on which notch or orientation flat alignment has been performed by the other region are transferred to the boat.

This substrate processing method comprises three methods, as diagrammed in FIGS. 5A,5B and 5C. The first method is a method wherewith, in parallel with the performing of substrate notch or orientation flat alignment with the one region, the transporting of the substrates prior to notch or orientation flat alignment to the other region are performed (cf. FIG. 5A). The second method is a method wherewith, in parallel with the performing of substrate notch or orientation flat alignment with the one region, substrates on which notch or orientation flat alignment have been performed and discharged from the other region are transported to the boat (cf. FIG. 5B). And the third method is a method wherewith, in parallel with the performing of substrate notch or orientation flat alignment with the one region, substrates on which notch or orientation flat alignment have been performed and discharged from the other region are transported to the boat, and, concurrently therewith, the transporting of the substrates prior to notch or orientation flat alignment to the other region is performed (cf. FIG. 5C).

According to the present invention, the substrate alignment apparatus comprises a plurality of regions that operate dependently, wherefore, if notch or orientation flat alignment have been performed alternately using the plurality of regions, substrates on which notch or orientation flat alignment has been performed can be left in one region and the next substrates removed beforehand from the substrate accommodating container and prior to notches or orientation flat alignment can be loaded in the other region that is empty. Also, two operations that do not interfere with the notch or orientation flat alignment operation can be performed while notch or orientation flat alignment is being done in the one region or the other region, namely the loading of substrates removed from the substrate alignment apparatus into the boat, and the removal of substrates from the substrate accommodating container. Accordingly, the substrate transfer apparatus wait time is reduced, and substrate processing throughput can be improved.

The substrate processing method described in claim 6, as diagrammed in FIG. 5C, is the substrate processing method according to claim 5, wherein, using the substrate transfer apparatus, after substrates, discharged from the other region, on which notch or orientation flat alignment has been performed by the other region are transported from the other region to the boat, substrates prior to notch or orientation flat alignment are transported from the substrate accommodating container to the other region. Based on the present invention, the transport of substrates prior to notch or orientation flat alignment that is the first operation in the processing cycle is performed after the transfer of the substrates on which notch or orientation flat alignment has been performed to the boat, which is the final operation in the processing cycle. Therefore, it becomes possible to use a single substrate transfer apparatus efficiently, and to improve substrate processing throughput.

The substrate processing method described in claim 7 is the substrate processing method according to claim 5, wherein the transporting of substrates prior to notch or orientation flat alignment from the substrate accommodating container to the other region by the substrate transfer apparatus is performed by taking out substrates prior to notch or orientation flat alignment from the substrate accommodating container and transporting these substrates to vicinity of the other region; and the method is designed such that, after notch or orientation flat alignment of substrates in the one region, the substrates taken out from the substrate accommodating container and transported to the vicinity of the other region are loaded into the other region.

This substrate processing method comprises two methods, as diagrammed in FIGS. 6A and 6B. The first method is a method wherewith, in transporting substrates prior to notch or orientation flat alignment to the other region, in parallel with performing substrate notch or orientation flat alignment in the one region, the transporting of these substrates is an operation that extends from the removal of substrates prior to notch or orientation flat alignment from the substrate accommodating container to the transporting thereof to the vicinity of the other region, after which, the timing of the loading of the substrates prior to notch or orientation flat alignment in the other region is set after the substrate notch or orientation flat alignment in the one region (cf. FIG. 6A). The second method is a method wherewith, when performing the transporting of substrates prior to notch or orientation flat alignment to the other region, after transferring substrates, on which notches or orientation flats alignment has been performed, discharged from the other region to the boat, in parallel with the performing of substrate notch or orientation flat alignment in one region, the transporting of these substrates is an operation extending from the removal of substrates prior to notch or orientation flat alignment from the substrate accommodating container to the transporting thereof to the vicinity of the other region, whereafter, the timing of the loading of the substrates prior to notch or orientation flat alignment in the other region is set after the substrate notch or orientation flat alignment in the one region (cf. FIG. 6B).

Based on the present invention, during the substrate notch or orientation flat alignment in the one region, the loading of the substrates prior to notch or orientation flat alignment removed beforehand from the substrate accommodating container in the other region is performed after the substrate notch or orientation flat alignment in the one region, wherefore the loading of the substrates prior to notch or orientation flat alignment in the other region can be performed with the substrates on which notch or orientation flat alignments has been performed in the one region left remaining. Accordingly, compared to when notch or orientation flat aligned substrates present in the one region is first cleared out and then the loading of substrates to the other region is performed, the notch or orientation flat alignment of substrates in the other region can be performed quickly. As a result, the substrate transfer apparatus can be utilized more efficiently, and substrate processing throughput can be improved.

The substrate processing method described in claim 8, as diagrammed in FIG. 7, is a substrate processing method, comprising: providing a single substrate transfer apparatus and a substrate alignment apparatus, the substrate transfer apparatus being for transferring at one time a plural number of substrates either from a substrate accommodating container to the substrate alignment apparatus or from the substrate alignment apparatus to a boat, the substrate alignment apparatus having a plurality of dependently operating regions being capable of performing notch or orientation flat alignment, in total, on a number of substrates that is twice or more of the number of substrates which the substrate transfer apparatus transports at one time; taking out substrates prior to notch or orientation flat alignment by the substrate transfer apparatus from the substrate accommodating container and loading these substrates into one region of the plurality of regions of the substrate alignment apparatus; performing notch or orientation flat alignment on the substrates by the one region of the substrate alignment apparatus: taking out substrates prior to next notch or orientation flat alignment from the substrate accommodating container by the substrate transfer apparatus during notch or orientation flat alignment in the one region; after completing the notch or orientation flat alignment of the substrates in the one regions, loading the substrates, which have been taken out for a next notch or orientation flat alignment, into other region of the plurality of regions; after loading the substrates into the other region, taking out the substrates, on which notch or orientation flat alignment has been performed in the one region, from the one region; after taking out the substrates from the one regions, performing notch or orientation flat alignment on the substrates by the other region; and transporting the substrates taken out from the one region to the boat, during notch or orientation flat alignment in the other region.

Here, the timing wherewith substrates are removed beforehand from the substrate accommodating container by the substrate transfer apparatus is set during the notch or orientation flat alignment. Provision is made so that the following happens. During the notch or orientation flat alignment in the one region, the next substrates prior to notch or orientation flat alignment are removed from the substrate accommodating container. After the notch or orientation flat alignment in the one region is finished, the removed next substrates prior to notch or orientation flat alignment are loaded into the other region. After the loading into the other region, the substrates on which notch or orientation flat alignments has been performed in the one region are removed from the one region. After the removal from the one region, notch or orientation flat alignment is performed in the other region. And, during the notch or orientation flat alignment in the other region, the substrates removed from the one region are loaded into the boat. Therefore, even if the one region in the substrate alignment apparatus operates in dependence on the other region, the substrate transfer apparatus waiting time is reduced, the substrate transfer apparatus is used efficiently, and substrate processing throughput can be improved.

The substrate processing apparatus described in the invention is a substrate processing apparatus comprising: a single substrate transfer apparatus; a plural number of substrate alignment units; and a controller; wherein the substrate transfer apparatus is for transferring a plural number of substrates at one time either from the substrate accommodating container to the substrate alignment units or from the substrate alignment units to a boat; the substrate alignment units are for independently performing notch or orientation flat alignment on a plural number of substrates which have been transported by the substrate transfer apparatus; and the controller performs a control so that, in parallel with performing the notch or orientation flat alignment on substrates by one unit of the substrate alignment units, substrates prior to notch or orientation flat alignment are transferred to other unit or units of the substrate alignment units, or substrates on which notch or orientation flat alignment has been performed by other unit or units of the substrate alignment units are transferred from the other unit or units of the substrate alignment units to the boat. Based on the present invention, the methods described in claims 2, 3 and 4 can be implemented suitably by a simple structure.

The substrate processing method described in the invention is a substrate processing apparatus comprising: a single substrate transfer apparatus; a substrate alignment apparatus; and a controller; wherein the substrate transfer apparatus is for transporting a plural number of substrates at one time either from the substrate accommodating container to the substrate alignment apparatus or from the substrate alignment apparatus to a boat; the substrate alignment apparatus has a plurality of regions for performing notch or orientation flat alignment on a plural number of substrates which have been transported by the substrate transfer apparatus; and the controller performs a control so that, in parallel with performing the notch or orientation flat alignment on substrates by one region of the plurality of regions, using the substrate transfer apparatus, substrates prior to notch or orientation flat alignment are transported from the substrate accommodating container to other region of the plurality of regions, or substrates, discharged out from the other region, on which notch or orientation flat alignment has been performed by the other region are transported to the boat. Based on the present invention, the methods described in claims 5, 6, 7 and 8 can be implemented suitably by a simple structure.

BRIEF DESCRIPTION OF THE DRAWINGS

FIGS. 4A,4B and 4c are explanatory diagrams for an invention method;

FIGS. 5A,5B and 5c are explanatory diagrams for an invention method;

FIGS. 6A and 6B are explanatory diagrams for an invention method;

FIG. 8A is a specific explanatory diagram for invention content;

FIG. 9 is an explanatory diagram representing operations when the type 1 notch alignment apparatus diagrammed in FIG. 15 is used;

FIGS. 19A, 19B, 19C, and 19D are explanatory diagrams for the operations of a type 2 apparatus lift-up pole.

DESCRIPTION OF THE PREFERRED EMBODIMENTS

Figure 8B:
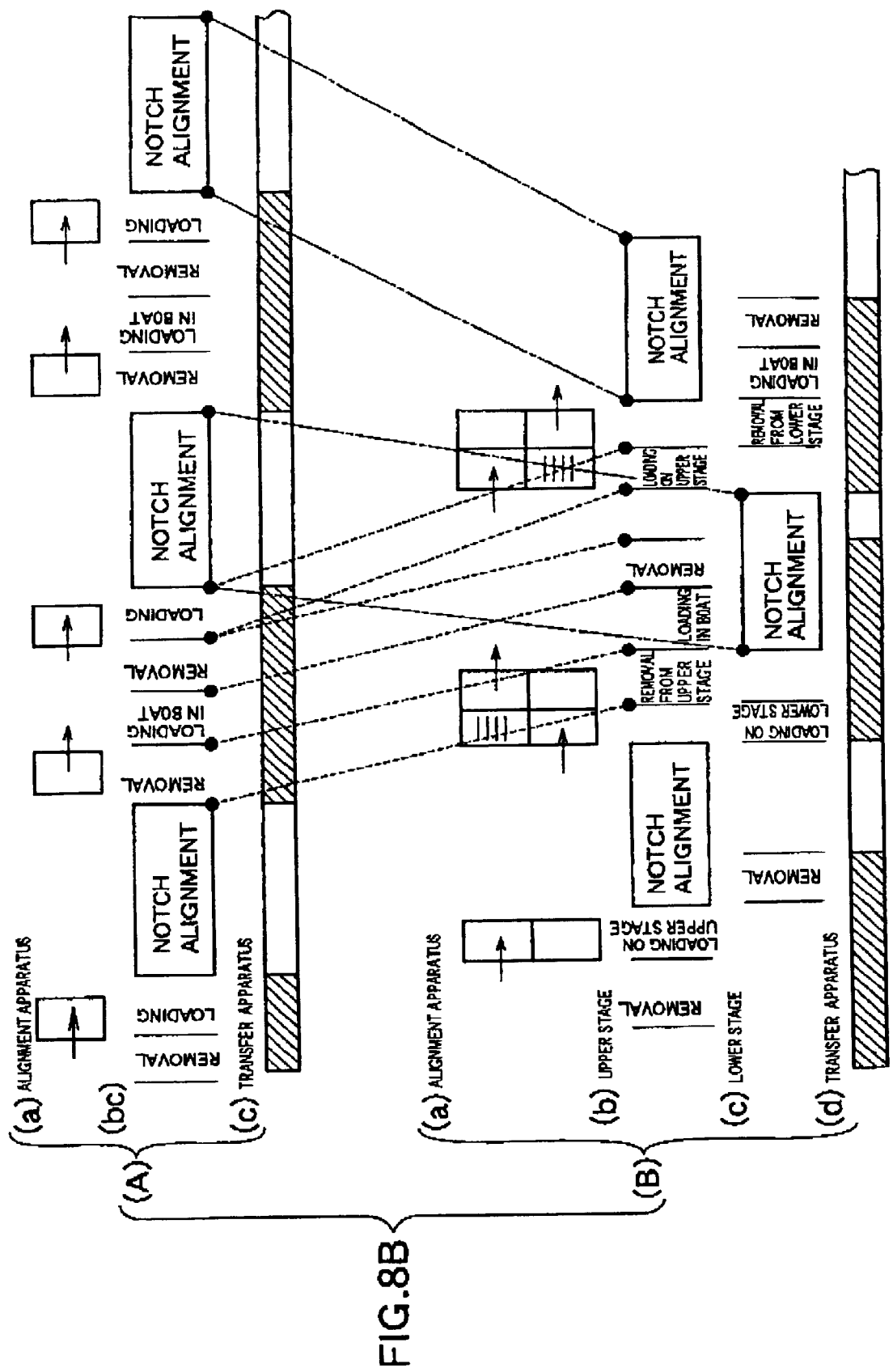
FIG. 8B is a specific explanatory diagram for invention content.

Before describing the embodiment aspects, in the interest of clarity, a specific example of the substrate processing method of the present invention is described, in comparison to a conventional example, using FIG. 8A and FIG. 8B that describe the operations of the apparatus. In FIG. 8A and FIG. 8B, the horizontal axis represents time. FIG. 8A and FIG. 8B represent specific example 1 that comprises two substrate alignment apparatuses and has the capability of notch- or orientation flat alignment twice the number of substrates transported by the substrate transfer apparatus. FIG. 8B(A) represents a conventional example a single substrate alignment apparatus having only a notch or orientation flat alignment capability for the same number of process substrates as the number transported by the transfer device. FIG. 8B(B) represents a specific example 2 comprising a substrate alignment apparatus having double the notch or orientation flat alignment capability, even though the number thereof is 1.

In FIG. 8A and FIG. 8B, at (a) is diagrammed the situation with two substrate alignment apparatuses, being an upper and a lower one. The arrows entering the two (upper and lower) substrate alignment apparatuses connote the loading of substrates, while the arrows leaving the substrate alignment apparatuses connote the removal of substrates, respectively. The caption "in progress" connotes that notch or orientation flat alignment is in progress. At (b) is diagrammed the operation of the upper stage substrate alignment apparatus. "Removal" connotes the removal of substrates from the substrate accommodating container, "upper loading" the loading of substrates into the upper stage substrate alignment apparatus, "upper removal" the removal of substrates from the upper stage substrate alignment apparatus, and "boat loading" the loading of removed substrates into the boat, respectively. At (c) is diagrammed the operation of the lower stage substrate alignment apparatus. "Lower loading" connotes the loading of substrates into the lower stage substrate alignment apparatus, and "lower removal" the removal of substrates from the lower stage substrate alignment apparatus, respectively. At (d) is diagrammed the running condition of the transfer device, with the hatched portions connoting equipment currently running, and the non-hatched portion connoting equipment currently waiting. At (bc) in FIG. 8B(A) is diagrammed the operation of a conventional substrate alignment apparatus.

In order to transport substrates using the substrate transfer apparatus, because there is only a single substrate transfer apparatus, the most efficient transporting procedure will consist of the operation procedures given in (1) to (4) below.

(1) Removal of orientation flat or notch aligned substrates from substrate alignment apparatus: If the orientation flat or notch aligned substrates are not removed from the substrate alignment apparatus, the next substrates to be orientation flat or notch aligned cannot be loaded into the substrate alignment apparatus.

(2) Loading of orientation flat or notch aligned substrates into boat: If the orientation flat or notch aligned substrates removed from the substrate alignment apparatus are left riding in the substrate transfer apparatus, new substrates cannot be loaded in the substrate transfer apparatus, wherefore the next substrates to be orientation flat or notch aligned cannot be transported. In order to make this transporting possible, the orientation flat or notch aligned substrates removed from the substrate alignment apparatus must be loaded into the boat.

(3) Removal of substrates prior to orientation flat or notch alignment from substrate accommodating container: Once the substrate transfer apparatus has become empty, the next substrates to be orientation flat or notch aligned are prepared.

(4) Loading of removed substrates prior to orientation flat or notch alignment into alignment apparatus: Once the substrates prior to orientation flat or notch alignment have been removed from the substrate accommodating container, in order to make provision for the next transportation, the removal substrates loaded into the substrate transfer apparatus should be loaded into the substrate alignment apparatus.

Of the operations (1) to (4) noted above, it is in (1) and (4) that interference occurs while the substrate alignment apparatus is engaged in orientation flat or notch alignment, whereas it is operations (2) and (3) that do not interfere with the substrate alignment apparatus.

Now, even if the processing capability is raised so that the number of substrates on which the substrate alignment apparatus can perform notch or orientation flat alignment at one time becomes twice or more than the number of substrates that a single substrate transfer apparatus transports at one time, if the number of substrates on which the substrate alignment apparatus performs notch or orientation flat alignment at one time is set as the possible number noted above that is the limit of substrate alignment apparatus capability, unless the notch or orientation flat aligned substrates are removed a number of times from the substrate alignment apparatus, after the notch or orientation flat alignment has been performed by the substrate alignment apparatus, it will become impossible to load the next substrates to be notch or orientation flat aligned into the substrate alignment apparatus. For that reason, even if two substrate alignment apparatuses are provided, it becomes impossible to effect parallel operation.

As diagrammed in FIG. 8A, in specific example 1 where two substrate alignment apparatuses are provided so that twice the number of substrates that is transported at one time by a single substrate transfer apparatus can be notch or orientation flat alignment, even when the upper stage substrate alignment apparatus or the lower stage substrate alignment apparatus is currently performing orientation flat alignment, these will not interfere with each other, wherefore any of the operations (1) to (4) described earlier can be performed. As a result, the substrate transfer apparatus waiting time is reduced, the substrate transfer apparatus can be used efficiently, and substrate processing throughput can be improved.

As diagrammed in FIG. 8B(A), in the conventional example where there is only a positioning capability for the same number of substrates as that carried by the transfer device, serial processing is in effect and not parallel processing, wherefore, unless all of the operations from (1) to (4) have been completed, notch or orientation flat alignment cannot be done. As a consequence, throughput cannot be improved.

As diagrammed in FIG. 8B(B), in specific example 2 wherein a single substrate alignment apparatus having twice the capability dependently is provided, while leaving notch or orientation flat aligned substrates loaded in one stage, substrates prior to notch or orientation flat alignment can be loaded in the other stage, wherefore, during the interval between the upper and lower stage notch or orientation flat alignment, the loading operation in (4) and the removal operation in (1) can be performed and the boat loading operation in (2) and the removal operation in (3) can be performed during notch or orientation flat alignment. For that reason, the timing for the second and following notch alignment can be set faster than in the conventional example. In addition, the operating efficiency of the substrate transfer apparatus can be improved over the conventional example.

Embodiment aspects of the present invention are now described in the embodiment aspects, descriptions are given for cases where a notch is used as the substrate positioning mark, but that may also be an orientation flat. Also, the number of wafers for which notches can be detected at one time is made 5, but that poses no limit, and that number may be any number so long as it is plural.

Figure 1:
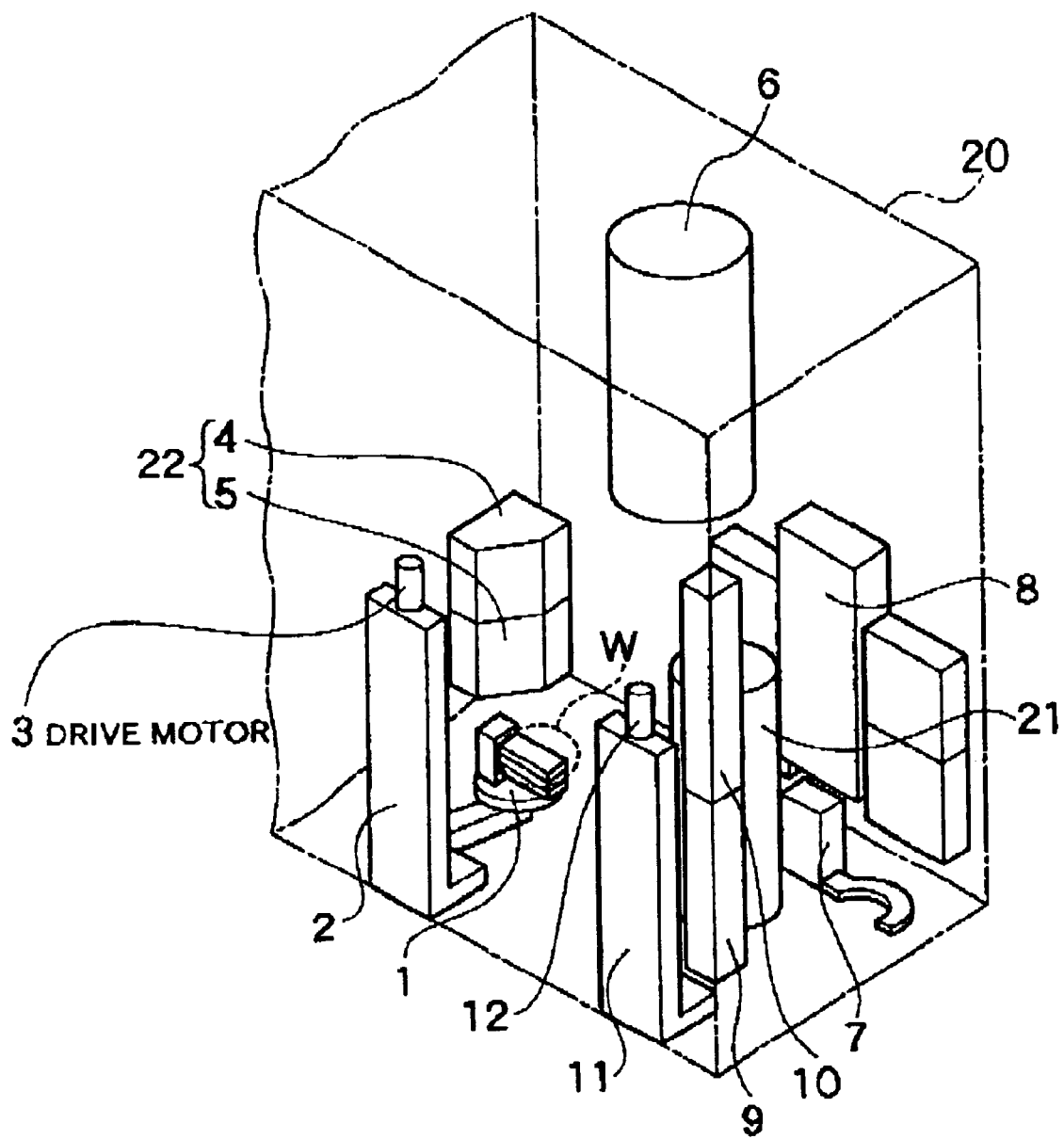
FIG. 1 is an external view of an upright dispersion-CVD apparatus having a notch alignment apparatus based on an embodiment aspect.
Figure 2:
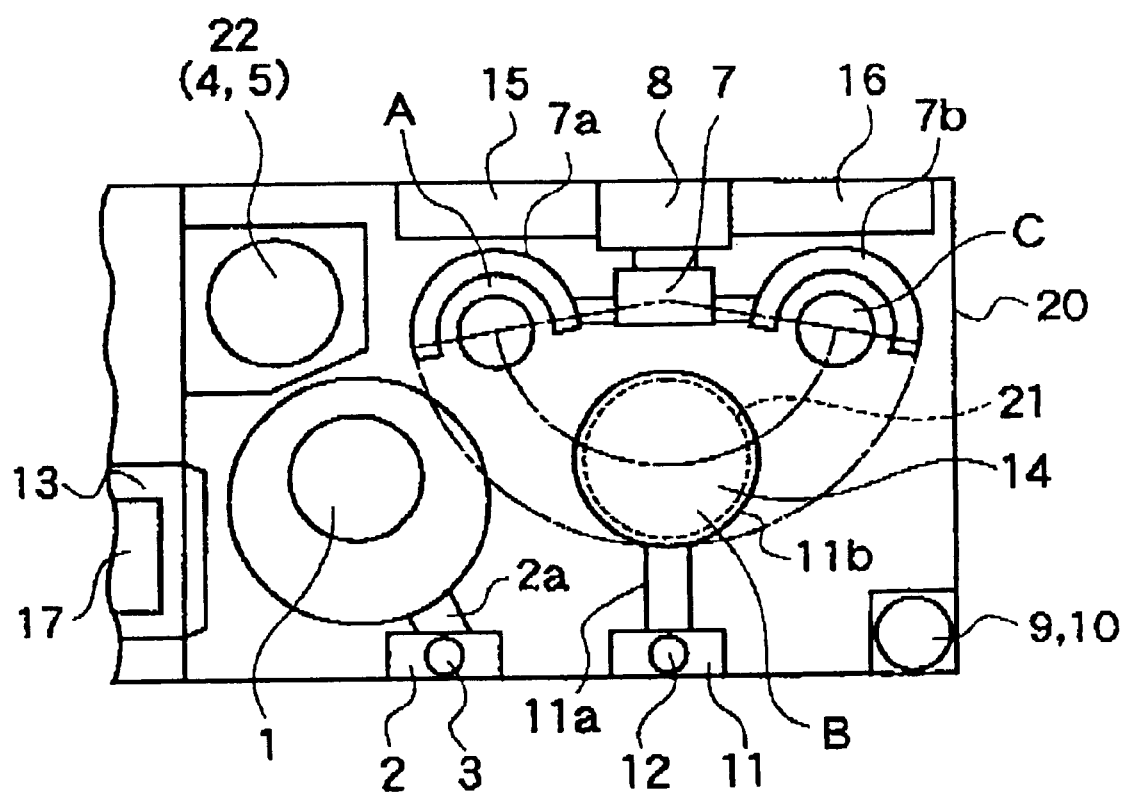
FIG. 2 is a plan of an upright dispersion-CVD apparatus having a notch alignment apparatus based on an embodiment aspect.
Figure 3A:
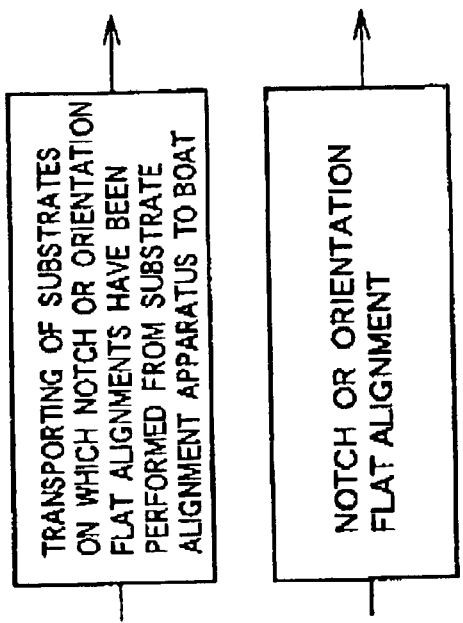
FIGS. 3A,3B and 3c are explanatory diagrams for an invention method.
Figure 3B:
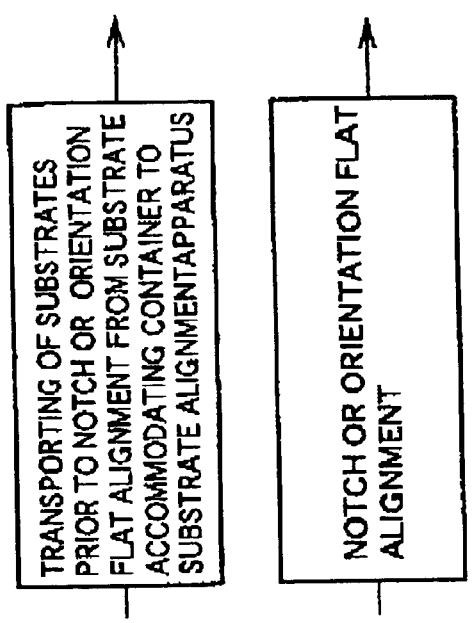
Figure 3C:
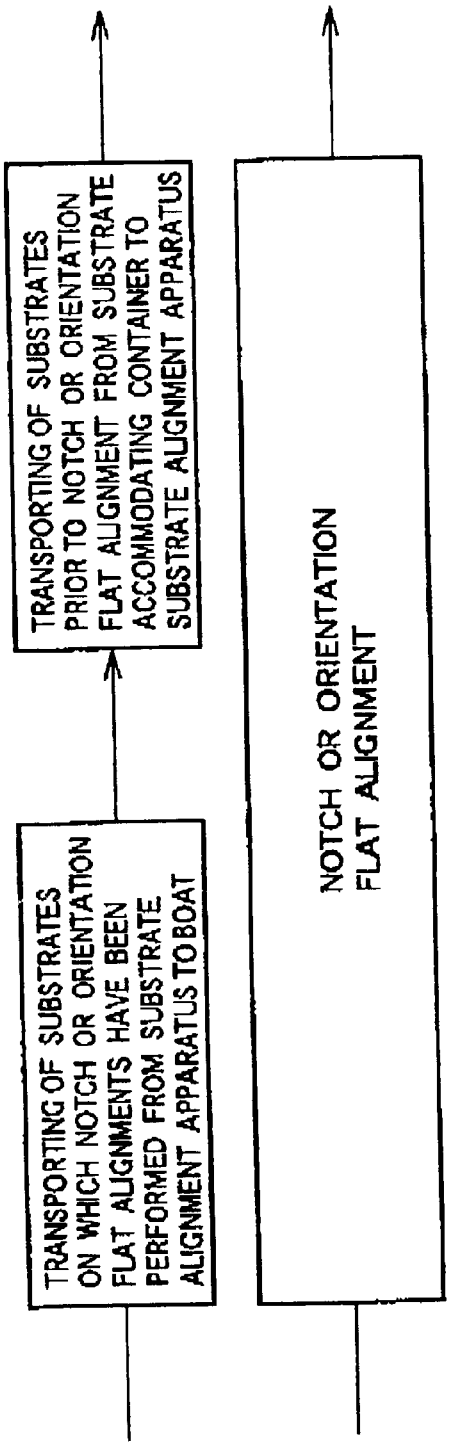
Figure 7:
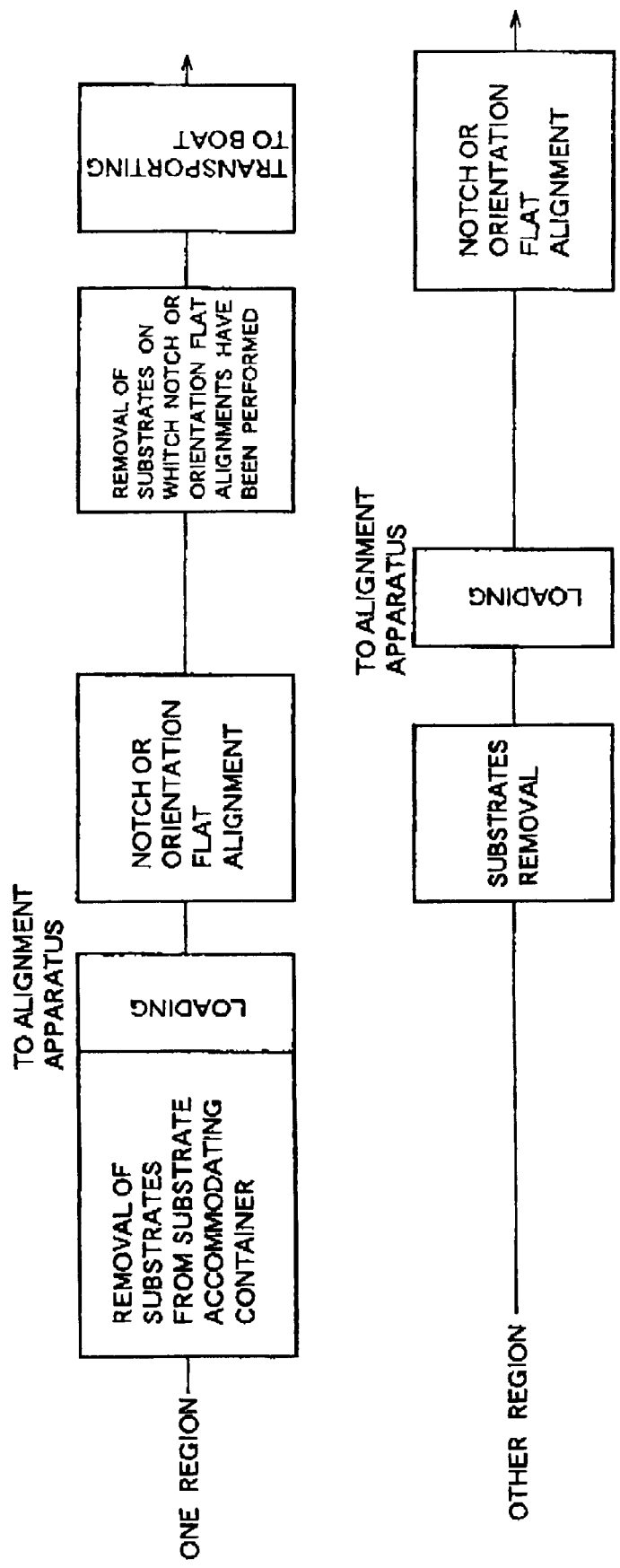
FIG. 7 is an explanatory diagram for an invention method.

In FIG. 1 is given an external view of an upright dispersion-CVD apparatus having substrate alignment apparatus based on an embodiment aspect, while in FIG. 2 is given a plan of the apparatus diagrammed in FIG. 1.

As diagramed in FIG. 1, the upright dispersion-CVD apparatus comprises a housing 20 that is roughly a rectangular parallelepiped. Inside the housing 20 are deployed a reaction oven 6 for heating wafers W with a heater and performing a film growing process thereon, a boat 21 that is inserted inside the reaction oven 6 for accommodating and treating a plural number of wafers W accommodated in multiple levels, a boat exchanger 7 for exchanging the boat 21, a boat elevator 11 for raising and lowering the boat 21 for inserting the boat 21 into and removing it from the reaction oven 6, a substrate alignment apparatus 22 for performing single-batch notch alignment on a plural number of wafers W before inserting those wafers W into the boat 21, a single substrate transfer apparatus 1 for moving a plural number of wafers W prior to processing in a single batch from a substrate accommodating container (not shown) and loading those wafers W into the substrate alignment apparatus 22, and for moving the plural number of notch-aligned wafers W from the substrate alignment apparatus 22 and loading those wafers W in a single batch into the boat 21, and a transfer device elevator 2 for raising and lowering the substrate transfer apparatus 1.

The substrate alignment apparatus 22 is configured of two notch alignment units 4 and 5 stacked in upper and lower stages. With the upper stage notch alignment unit 4 and the lower stage notch alignment unit 5, it is possible to perform total positioning on twice or more (but here twice) the number of wafers as that number which is transported at one time by the substrate transfer apparatus 1.

As diagrammed in FIG. 2, the boat 21 can assume three positions, moved so as to describe a circular arc shaped track by turning arms 7a and 7b of a boat exchanger 7. In the center of the circular arc is a boat loading/unloading position B for inserting the boat 21 into the reaction oven 6 and removing the boat 21 from the inside of the reaction oven 6, at the left end of the circular arc is a position A for moving and loading wafers into the boat 21 by the substrate transfer apparatus 1, and at the right end of the circular arc on the opposite side is a boat withdrawal position C. A circular boat sealing cap 11b indicated on the elevator platform 11a of the boat elevator 11 on which the boat 21 is loaded is deployed at the bottom part of the boat 21, which, when the boat 21 is inserted into the reaction oven 6, seals the opening in the bottom part of the reaction oven 6 in an airtight manner.

A pod opener 13 is deployed in a vicinity of the substrate transfer apparatus 1 that is on the left side of the housing 20. This pod opener 13 opens and closes the cover of the pod 17 serving as a substrate accommodating container, being made so that it can extract wafers W accommodated inside the pod.

Furthermore, the substrate transfer apparatus 1 that is attached to the elevator platform 2a of the transfer device elevator 2 is deployed on one side of the pod loading/unloading position B (on the left side in FIG. 2), being made so that it can move and load a plural number (5, for example) of wafers W at one time. The substrate transfer apparatus 1 extracts 5 wafers W prior to notch alignment in one batch from the pod and transports them to and loads them into the notch alignment unit 4 or 5 at the upper left corner of the housing 20, and extracts 5 wafers W that have been notch aligned in one batch from the notch alignment unit 4 or 5 and transports them to and loads them into the boat 21 at the wafer transfer position A. The operation of taking the wafers W out of the pod and transporting them to and loading them into the notch alignment unit 4 or 5 is "transfer." The operation of taking the wafers W out of the notch alignment unit 4 or 5 and transporting them to and loading them into the boat 21 is also "transfer."

The boat exchanger 7 here functions in the following way. Two empty boats 21 and 21 are placed beforehand in the A and C positions, respectively. To and into the boat 21 in the A position are moved and loaded wafers W on which notch alignment has been performed by the substrate alignment apparatus 22, removed from the pod 17, and the boat 21 is filled. The boat 21 in the A position, filled with the notch aligned wafers W, is brought by the turning arm 7a to the B position, raised and loaded into the reaction oven 6, and subjected to prescribed processing. While processing is going on in the reaction oven 6, the empty boat 21 in the C position is brought by the turning arm 7b to the A position, other wafers W prior to notch alignment are removed from the pod, those wafers W are subjected to notch alignment by the substrate alignment apparatus 22, and transferred to the boat 21, and the boat 21 is filled.

(a) Once the processing of the boat 21 in the reaction oven 6 has finished, that boat 21 is unloaded, lowered to the B position, brought to the withdrawal position C by the turning arm 7b, and cooled with a clean air delivery unit 16.

(b) While that boat 21 is being cooled, the boat 21 filled with the notch aligned wafers W at the A position is moved to the B position by the turning arm 7a, raised from the B position and loaded into the reaction oven 6, and subjected to processing.

(c) While that boat 21 is being processed in the reaction oven 6, the boat 21 cooled at the C position is brought to the A position by the turning arm 7b, and the processed wafers W at the A position are removed and returned to the pod.

(d) To the boat 21 that has become empty with the removal of the processed wafers W, wafers W that have been notch aligned by the substrate alignment apparatus 22, and newly removed from the pod, are moved, and loaded therein, to fill the boat 21.

Thereafter, the operations from (a) to (d) are repeated again and again.

Furthermore, a thin clean unit 8 having clean air delivery units 15 and 16 on either side thereof is deployed behind the boat exchanger 7 inside the housing 20. Also, exhaust fans 9 and 10 are deployed in corners diagonally opposite from the notch alignment units 4 and 5 inside the housing 20. Also, a drive motor 12 that serves as the elevator drive source is deployed above the boat elevator 11, and a drive motor 3 that serves as the elevator drive source is deployed above the transfer device elevator 2.

The substrate alignment apparatus 22 is next described. In this embodiment aspect, there are two types of substrate alignment apparatus 22, namely a type 1 wherein the upper and lower notch alignment units operate independently of each other, and a type 2 wherein they operate dependently.

Figure 13:
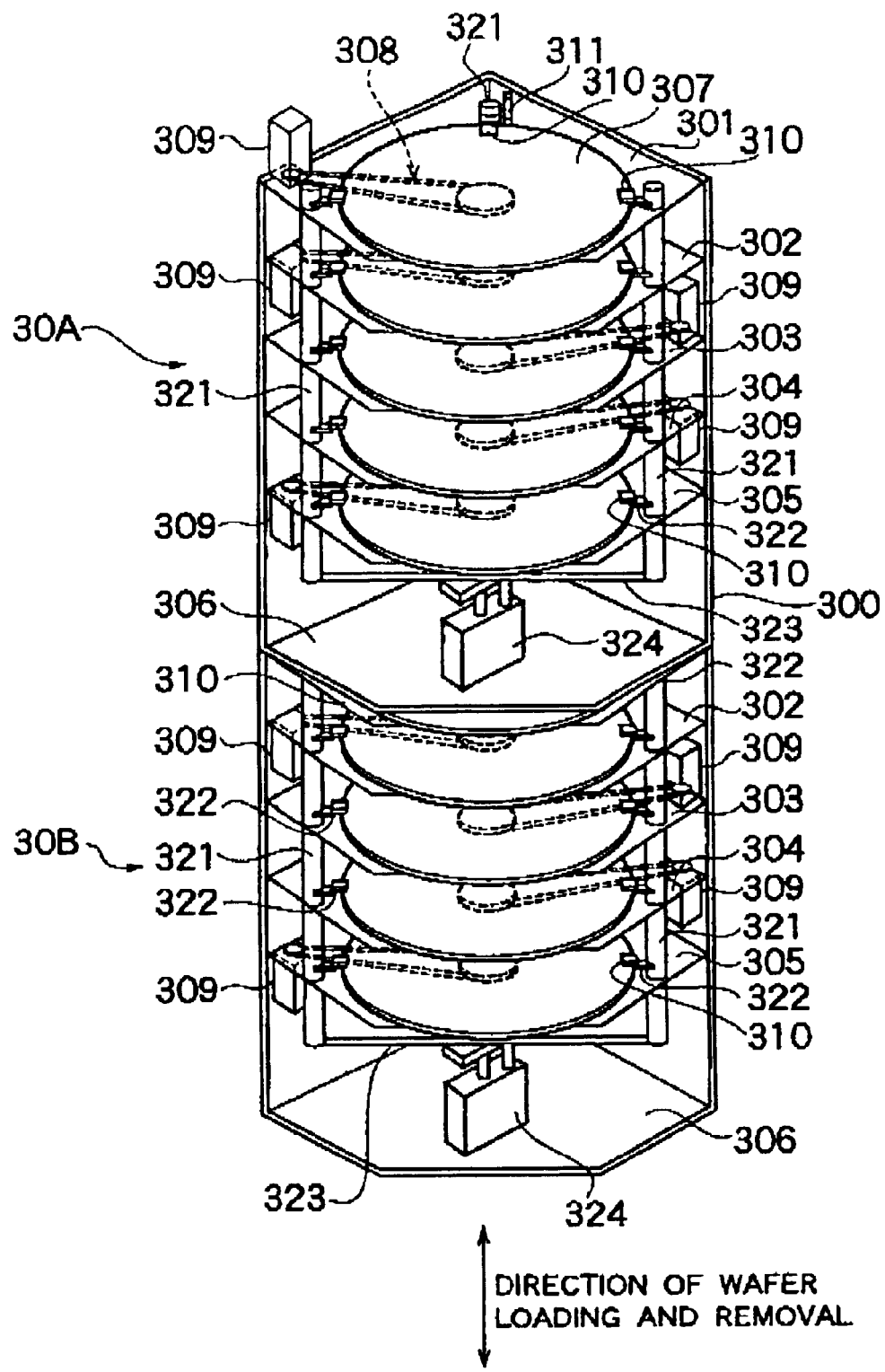
FIG. 13 is an external view of a notch alignment apparatus (type 1) based on an embodiment aspect.

In FIG. 13 is given an external view of a type 1 substrate alignment apparatus. The type 1 apparatus is configured with two upright notch alignment apparatuses 30A and 30B (corresponding to the two notch alignment units 4 and 5) that perform notch alignment on a plural number of wafers in a single batch. There are functions that, while the wafers W are being notch-aligned in one of the notch alignment apparatuses 30A (or 30B), move and load wafers W to and into the other notch alignment apparatus 30B (or 30A), or extract notch aligned wafers W from the other notch alignment apparatus 30B (or 30A) and move and load them to and into a boat.

The two notch alignment apparatuses 30A and 30B having the same structure are deployed in two stages, an upper and a lower, and the upper and lower stage notch alignment apparatuses 30A and 30B can separately perform single-batch notch alignment on 5 wafers. Here, the two notch alignment apparatuses 30A and 30B are used alternately and not simultaneously. The notch alignment action is as follows. Five wafers W are transported to the upper stage (or it may be the lower stage) substrate alignment apparatus 30A, and loaded onto the turntables 307. The turntables 307 are turned independently, the notches are detected by optical sensors 311, and the notches are aligned in a prescribed position (during which time, moreover, 5 wafers W are transferred to the lower stage notch alignment apparatus 30B). Once the notch alignment at all 5 turntables 307 is completed, the 5 wafers W are removed in a single batch from the upper stage notch alignment apparatus 30A by the substrate transfer apparatus 1 and transported to the boat 21 (which actions, moreover, are performed during the wafer notch alignment action in the lower stage notch alignment apparatus 30B). The same operations as for the upper stage are performed for the lower stage notch alignment apparatus 30B, notch alignment is performed on 5 wafers W, and the notch aligned wafers W are transferred to the boat 21.

The details of the configuration and operations of this apparatus will be described subsequently, but what is characteristic of this type 1 is that, because two notch alignment apparatuses 30A and 30B are deployed independently, while one notch alignment apparatus 30A (or 30B) is performing notch alignment, it is possible to perform wafer moving and loading to and into the other notch alignment apparatus 30B (or 30A) from the pod, and it is possible also to perform wafer moving and loading to and into the pod from the other notch alignment apparatus 30B (or 30A) to the boat 21.

Figure 15:
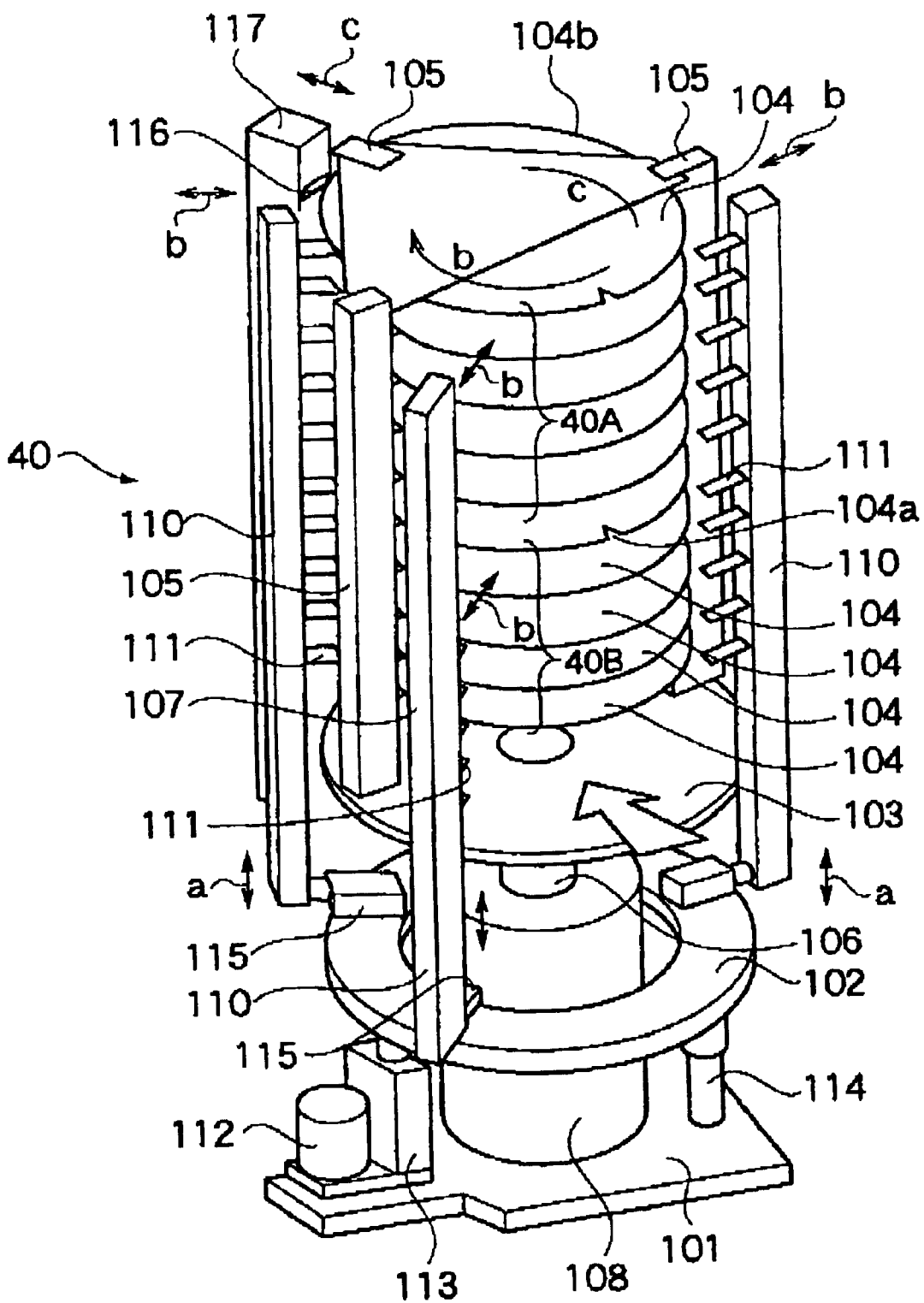
FIG. 15 is an external view of a notch alignment apparatus (type 2) based on an embodiment aspect.

In FIG. 15 is given an external view of a type 2 substrate alignment apparatus. The type 2 apparatus is configured with a single notch alignment apparatus 40 that has two regions 40A and 40B (corresponding to the two notch alignment units 4 and 5) that perform single-batch notch alignment on a plural number of wafers. While wafer notch alignment is being performed by one region 40A, in parallel therewith, wafer transporting operations are performed for the other region 40B. After the notch alignment is finished at one region 40A, wafers are transferred to the other region 40B, and notch aligned wafers are removed from the one region 40A. Then, while wafer notch alignment is being performed by the other region 40B, in parallel therewith, the removed notch aligned wafers W are transferred to the boat 21.

The notch alignment apparatus 40 is capable, with a single apparatus, of performing single-batch notch alignment on a number of wafers W that is twice the number of wafers transported at one time by the substrate transfer apparatus 1. This apparatus 40 is of a type that is turned about support poles 105 by one motor 106, turning the wafers 104 supported thereby, and performing notch alignment sequentially one wafer at a time. The wafers W are turned while being supported by the support poles 105 and, when the notch alignment is completed, are lifted up by a lifting-up pole 110, and the notch aligned wafers W are withdrawn. This is performed one wafer at a time in order from the wafer in the lowest stage until 5 wafers have been notch-aligned. The support pole 105 and the lifting-up pole 110 are configured so that they can handle 10 wafers W. In using these, the parts that perform the notch alignment are divided between the two (upper and lower) regions 40A and 40B, and the two regions 40A and 40B are used alternately and not simultaneously. The two regions 40A and 40B are made so that they separately perform notch alignment one wafer at a time. First, 5 wafers W are transported by the substrate transfer apparatus 11 to the upper stage (or it may be the lower stage) region 40A and loaded onto the support poles 105. The support poles 105 are turned independently, notches are detected by the optical sensors 116, and the notches are aligned in a prescribed position. During this time, furthermore, an operation is performed to transport 5 wafers to the lower stage region 40B by the substrate transfer apparatus 11. Once the notch alignment of all 5 wafers at the support poles 105 is finished, 5 wafers are loaded onto the support poles 105 in the lower stage region 40B. By that substrate transfer apparatus 1, 5 wafers W are removed in a single batch from the upper stage region 40A, transported to the boat 21, and loaded. In parallel with these actions, the notch alignment of wafers W is performed in the lower stage region 40B. The same operation as for the upper stage region 40A is performed for the lower stage region 40B, notch alignment is performed anew on 5 wafers, and the notch aligned wafers W are transferred to the boat 21.

The details of the configuration and actions of this apparatus will be described subsequently, but what is characteristic of this type 2 apparatus is that, even though, because it is configured with a single notch alignment apparatus 40, while notch alignment is being done in one region 40A, wafers cannot be transferred to the other region 40B, nevertheless, compared to the type 1 apparatus, it has the advantages of being easy to assemble and easily taught, etc. As to the ease of teaching, the type 1 apparatus is of such structure that one wafer W at a time is supported by the turntable 307, whereupon visual verification of the wafer support condition is very difficult, but the type 2 apparatus is of such structure that the wafers W are supported by support poles 105, and the bottoms of the wafers are open, wherefore it is easy to visually verify the wafer support condition, and teaching can be performed comparatively easily.

Figure 20:
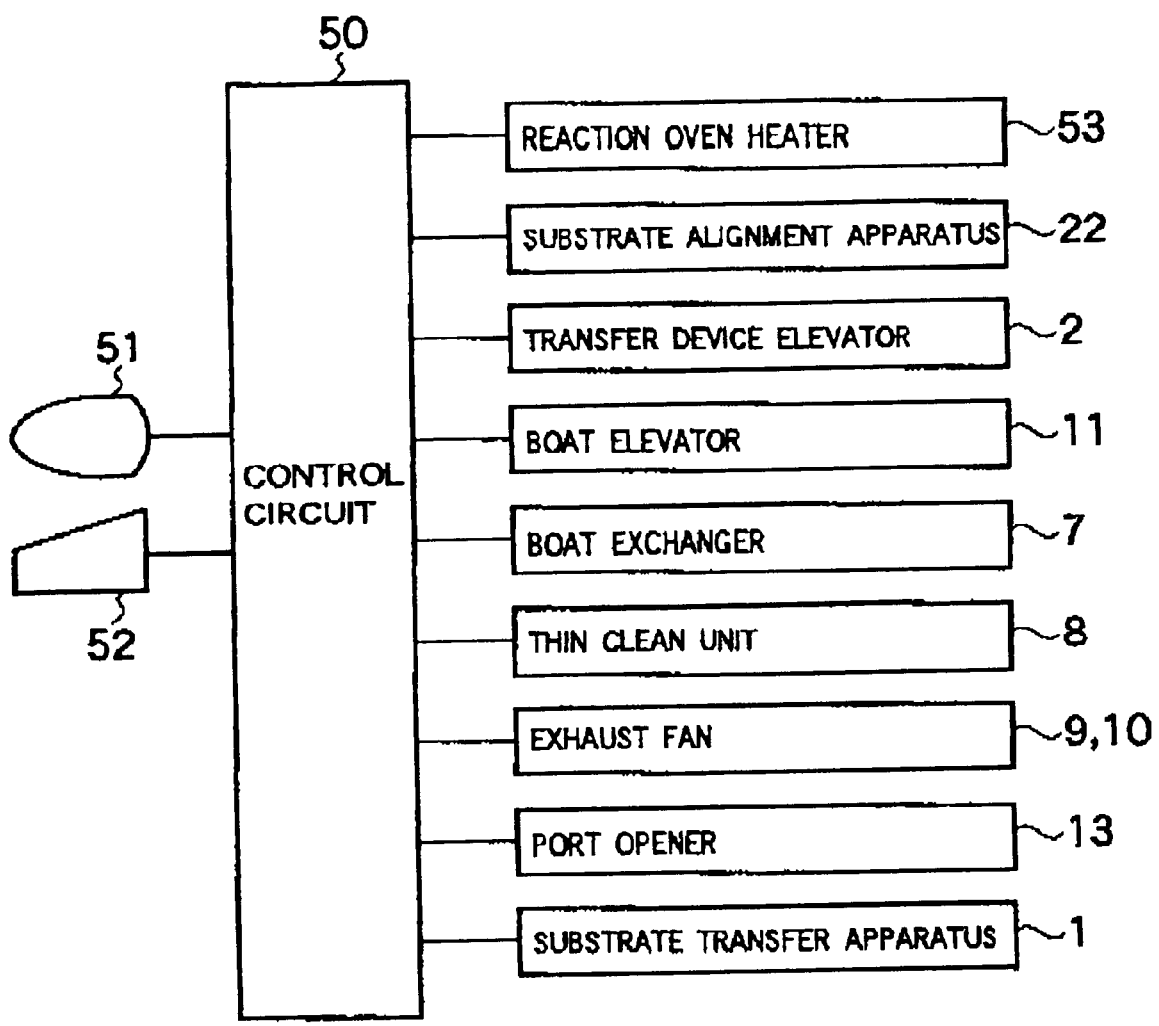
FIG. 20 is a configuration diagram for a control system in an embodiment aspect.

In FIG. 20, furthermore, a control circuit 50 is configured with arithmetic processing devices comprising arithmetic processing units and memories, a display 51 and keyboard 52 are connected, so that communications are possible between the substrate transfer apparatus 1 and the various elements, arithmetic computations and other processing are performed on the basis of data and the like provided by the keyboard 52, and the operations of the substrate transfer apparatus 1, reaction oven heater 53, substrate alignment apparatus 22, transfer device elevator 2, boat elevator 11, boat exchanger 7, thin clean unit 8, exhaust fans 9 and 10, and boat opener 13, etc, are controlled.

Next is described the timing of the operations of the substrate transfer apparatus that are performed in parallel with the notch alignment when the substrate alignment apparatuses of types 1 and 2 described in the foregoing, respectively, are used.

In FIG. 9 are diagrammed the notch alignment and wafer moving and loading operations when the type 1 substrate alignment apparatus is used. In FIG. 9, the top line (A) represents the operational conditions of the upper stage alignment apparatus and the content of the actions of the substrate transfer apparatus relative to that upper stage alignment apparatus, the middle line (B) represents the operational conditions of the lower stage alignment apparatus and the content of the actions of the substrate transfer apparatus relative to that lower stage alignment apparatus, and the bottom line (C) represents the operating conditions with only the timing of the actions of the substrate transfer apparatus removed.

Figure 10:
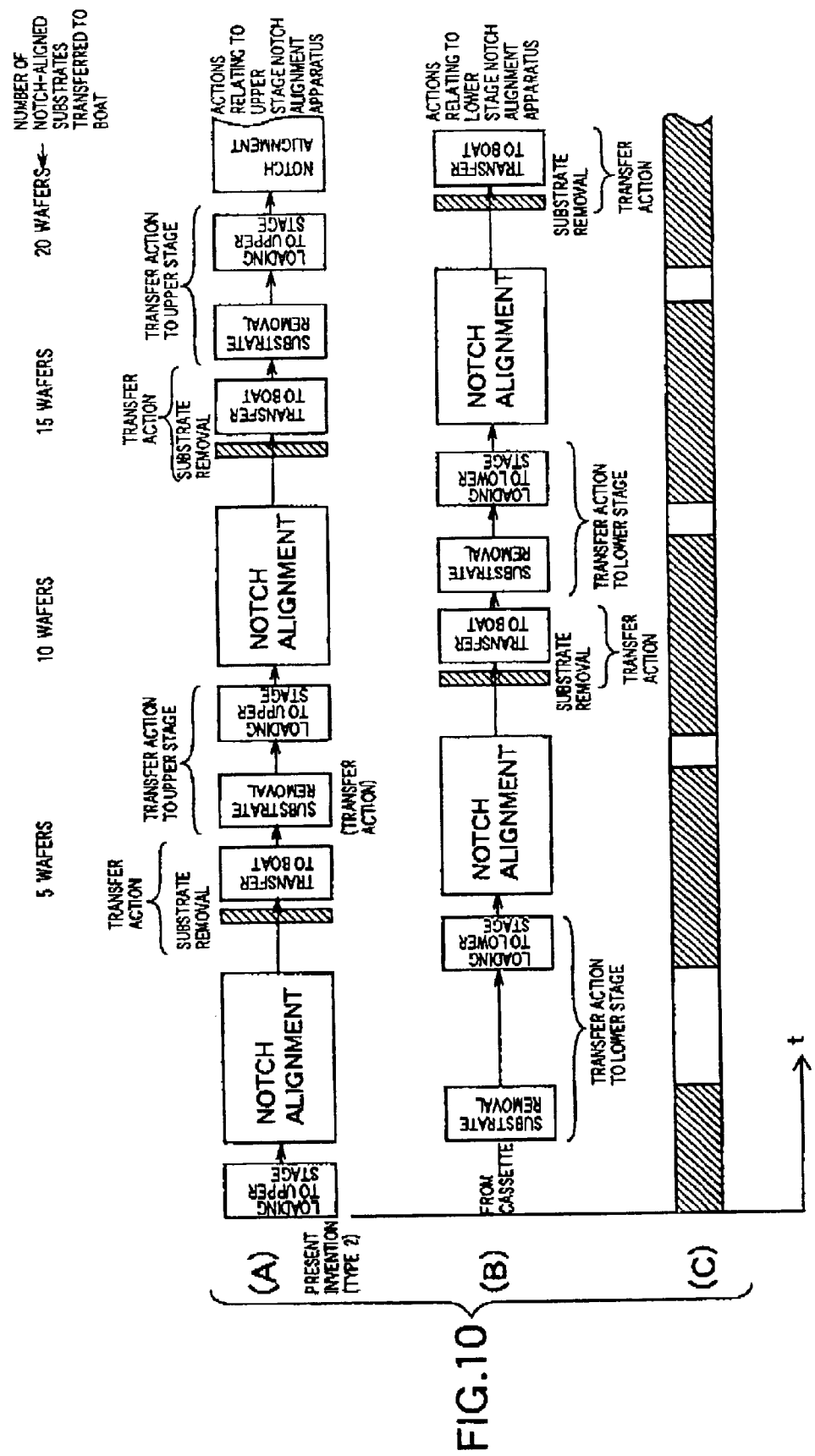
FIG. 10 is an explanatory diagram representing operations when the type 2 notch alignment apparatus diagrammed in FIG. 17 is used.
Figure 11:
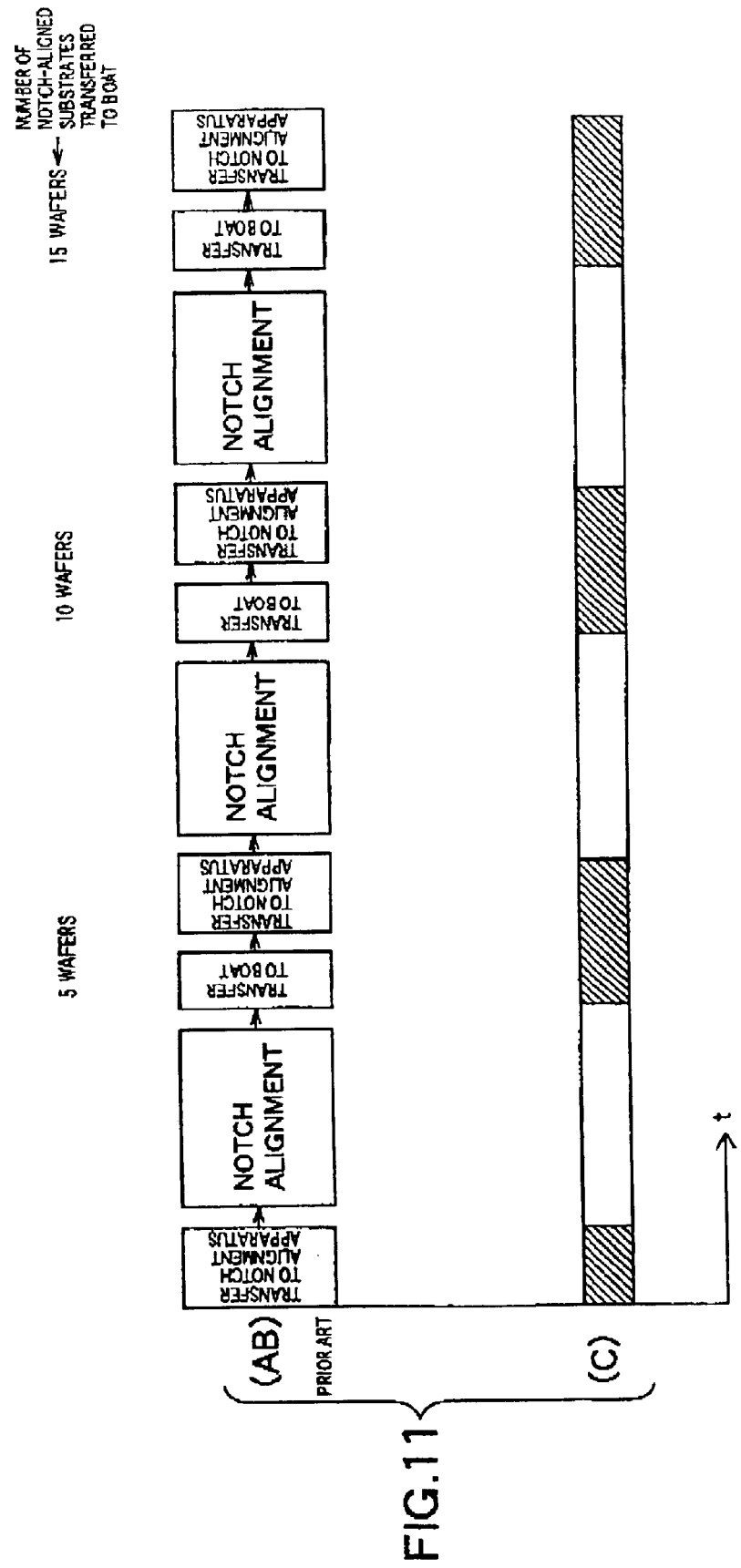
FIG. 11 is an explanatory diagram representing operations when a conventional notch alignment apparatus is used.
Figure 12:
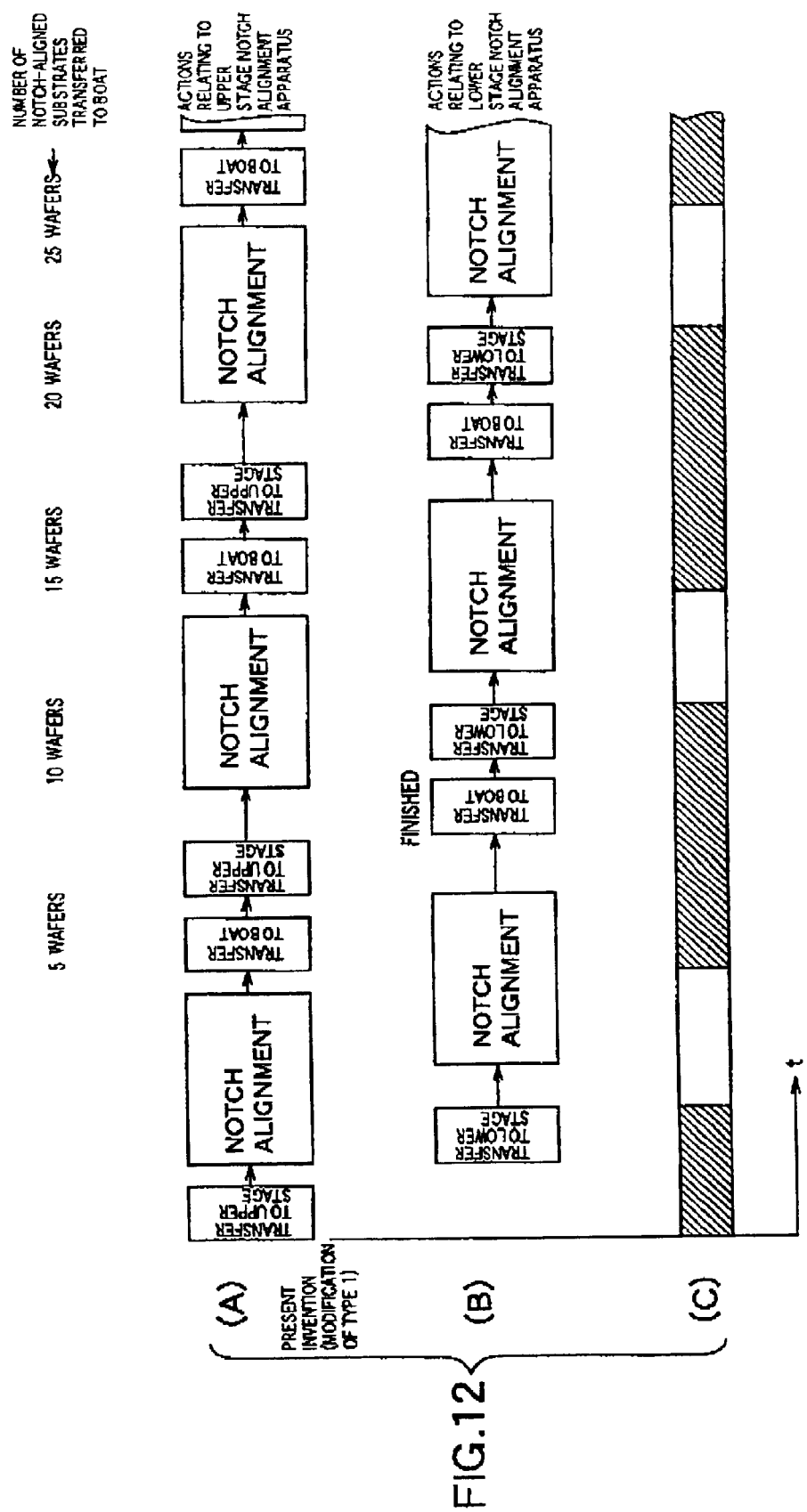
FIG. 12 is an explanatory diagram representing a modified operation example when the type 1 notch alignment apparatus is used.

In this diagram, by "transfer to upper stage" is meant "the actions inclusive of the removal of the wafers yet to be notch aligned from the pod, the transporting of them to the upper stage notch alignment apparatus, and the loading of them therein, by the substrate transfer apparatus" while by "transfer to lower stage" is meant "the actions inclusive of the removal of the wafers yet to be notch aligned from the pod, the transporting of them to the lower stage notch alignment apparatus, and the loading of them therein, by the substrate transfer apparatus." By "moving and loading to boat," moreover, is meant "the actions inclusive of the removal of the notch aligned wafers from the notch alignment apparatus, the transporting of them to the boat, and the loading of them therein." These meanings are the same in FIGS. 10 to 12.

First, from the pod the cover whereof has been opened by the pod opener 13, the first 5 wafers W are removed in a single batch, in a condition wherein they are placed horizontally, transported to the upper stage notch alignment apparatus 30A, and loaded therein, by the substrate transfer apparatus 1. Notch alignment is there performed. During the notch alignment in that upper stage, from the pod the cover whereof has been opened by the pod opener 13, the next 5 wafers W are removed in a single batch, by the substrate transfer apparatus 1. Those wafers W are transported to the lower stage notch alignment apparatus 30B and loaded therein.

After that, as soon as the first notch alignment in the upper stage notch alignment apparatus 30A is finished, notch alignment is performed by the lower stage notch alignment apparatus 30B. (Furthermore, the notch alignment done by the lower stage notch alignment apparatus 30B can also be performed before the notch alignment by the upper stage notch alignment apparatus is finished. That can be done, for example, immediately after wafers have been transferred to the lower stage notch alignment apparatus 30B.) During this notch alignment in the lower stage, the notch aligned wafers W on which the notch alignment in the upper stage has been finished are transferred to the boat 21 by the substrate transfer apparatus 1. After that moving and loading, the next 5 wafers prior to notch alignment are removed from the pod and transferred to the upper stage notch alignment apparatus 30A by the substrate transfer apparatus 1. The transfer of the wafers W to and into the boat and to and into the upper stage are performed during the notch alignment that is done by the lower stage notch alignment apparatus 30B. Similarly, while alternately performing notch alignment in the upper stage and lower stage, in parallel with those notch alignments, the moving and loading of wafers W to and into the boat 21 and to and into the notch alignment apparatuses 30A and 30B are performed by the substrate transfer apparatus 1.

Instead of serial processing wherein the next wafer can only be moved or loaded after waiting for the alignment processing to finish, as in the conventional operation diagrammed in FIG. 11, parallel processing is performed, using two notch alignment apparatuses 30A and 30B, without having to wait for the alignment process to end. Therefore, the number of wafers that can be alignment processed by the substrate alignment apparatus is increased, the transfer device wait time is decreased, and substrate processing throughput is improved.

Compared to the prior art, wherewith, at a point in time after a prescribed time interval has elapsed, the number of notch aligned wafers W moved to and loaded in the boat 21 was 15, with the type 1 apparatus, that number can be increased to 25, resulting in a nearly 70% improvement in wafer processing throughput.

In FIG. 10 are diagrammed the notch alignment and wafer moving and loading operations when the type 2 substrate alignment apparatus is used. In FIG. 10, the top line (A) represents the operational conditions of the upper stage region of the substrate alignment apparatus and the content of the actions of the substrate transfer apparatus relative to that upper stage region, the middle line (B) represents the operational conditions of the lower stage region of the substrate alignment apparatus and the content of the actions of the substrate transfer apparatus relative to that lower stage region, and the bottom line (C) represents the operating conditions with only the timing of the actions of the substrate transfer apparatus removed.

In this figure, moreover, by "substrate removal" prior to notch alignment is meant "the actions of removing wafers yet to be notch aligned from the pod and transporting them to the vicinity of the notch alignment region by the substrate transfer apparatus," By "substrate removal" after notch alignment is meant "the action of removing the notch aligned wafers from the notch alignment region by the substrate transfer apparatus." And by "transfer to boat" is meant "the actions of transporting the notch aligned wafers removed from the notch alignment region, and loading them thereinto, by the substrate transfer apparatus."

First, from the pod the cover whereof has been opened by the pod opener 13, the first 5 wafers W are removed in a single batch, in a condition wherein they are placed horizontally, transported to the upper stage region 40A, and loaded therein, by the substrate transfer apparatus 1. Notch alignment is there performed. During the notch alignment in that upper stage, from the pod the cover whereof has been opened by the pod opener 13, the next 5 wafers W are removed in a single batch, and transported to the vicinity of the lower stage region 40B, by the substrate transfer apparatus 1, where those wafers W wait until the wafer W notch alignment in the upper stage region 40A has finished.

After the first notch alignment in the upper stage region 40A has finished, the wafers W yet to be notch aligned are loaded into the lower stage region 40B by the substrate transfer apparatus 1 that was waiting in the vicinity of the lower stage region 40B. After that loading, the notch aligned wafers W for which notch alignment in the upper stage region 40A is finished are removed from the upper stage region 40A by the substrate transfer apparatus 1. After removal, those wafers W are subjected to notch alignment in the lower stage region 40B.

During that notch alignment in the lower stage, the wafers W completely notch aligned and removed from the upper stage region 40A by the substrate transfer apparatus 1 are transported to and loaded into the boat 21. After loading, the next 5 wafers yet to be notch aligned are removed in a single batch by the substrate transfer apparatus 1 from the pod, and transported to the vicinity of the upper stage region 40A, where those wafers wait until the notch alignment of wafers W in the lower stage region 40B has finished.

After the notch alignment in the lower stage region 40B has finished, the next wafers W yet to be notch aligned are loaded into the upper stage region 40A by the substrate transfer apparatus 1 that was waiting in the vicinity of the upper stage region 40A. After that loading, the completely notch aligned wafers W for which notch alignment in the lower stage region 40B has finished are removed by the substrate transfer apparatus 1 from the lower stage region 40B.

Thereafter, in similar fashion, while alternately performing notch alignment in the upper stage region 40A and notch alignment in the lower stage region 40B, during those notch alignments, the transporting of notch aligned wafers W to the boat 21 and the loading of them therein, and the removal of wafers W yet to be notch aligned from the pod and the transporting of them to the vicinity of the notch alignment regions, are performed. Also, during the interval between the upper stage region 40A notch alignment and the lower stage region 40B notch alignment, that is, during the time interval wherein no notch alignment is done, the loading of the wafers W yet to be notch aligned into the notch alignment regions and the removal of the wafers W after notch alignment from the notch alignment regions are performed. By so doing, although the operating rate of the substrate transfer apparatus 1 declines as compared to the type 1 apparatus, compared to the prior art diagrammed in FIG. 11, the substrate transfer apparatus wait time is reduced, wherefore the number of wafers that can be alignment processed by the notch alignment apparatus is increased, and substrate processing throughput is improved. At the point in time where a prescribed time interval has elapsed, as noted earlier, as compared to the prior art wherewith the number of notch aligned wafers W transferred to the boat 21 was 15, that number is increased to 20, resulting in a nearly 40% improvement in substrate processing throughput.

In the type 1 embodiment aspect, furthermore, provision was made so that the finishing of one notch alignment is waited for, and only then is another notch alignment performed. However, in the type 1 apparatus, the upper stage notch alignment apparatus 30A and the lower stage notch alignment apparatus 30B can be made to operate independently. Therefore, as diagrammed in FIG. 12, notch alignment timing can be moved forward so that a second notch alignment is performed without waiting for a first notch alignment to finish. In this embodiment aspect, the notch alignment operations performed by two notch alignment apparatuses partially overlap, wherefore, as compared to that diagrammed in FIG. 9, where the operations do not overlap, the positioning control performed by the control circuit 50 on the notch alignment apparatuses becomes slightly difficult.

Next, the configurations and operations of the type 1 and type 2 notch alignment apparatuses described in the foregoing are described specifically.

Type 1 configuration and operation (cf. FIGS. 13, 14):

In the type 1 substrate alignment apparatus, the configuration of the upper stage notch alignment apparatus 30A and the lower stage notch alignment apparatus 30B is the same, wherefore only the configuration of the upper stage is described. This is a substrate alignment apparatus, wherein 5 motors are provided corresponding to the number of wafers, that is capable of detecting the notches of 5 wafers in a single 5-wafer batch, while hardly touching the wafers at all.

As diagrammed in FIG. 13, the upper stage notch alignment apparatus 30A comprises a rectangular parallelepiped box body 300 having 5 stages of shelves 301 to 305, the front two surfaces of which box body 300 are open in an open suspension configuration. On the upper surfaces of the five shelves 301 to 305 are attached turntables 307, respectively, the turning centers whereof are made to coincide. The turntables 307 are made so that they can be driven to turn independently, in the drive mechanism whereof a timing belt 308 and motor 309 are used. The front surface corner portions of the shelves 301 to 305 are cut to form insertion/removal windows for the wafers 104.

In the outer circumferential part of the top surface of each turntable 307, three support pins 310 are deployed, placed in a dispersed manner at roughly 120° intervals, so as to be able to support the outer circumferential parts of the wafers. To the back of each of the shelves 301 to 305, on the opposite side from the wafer insertion window, moreover, U-shaped optical sensors 311 are attached, and the outer circumferential parts of the 5 wafers held by the support pins 310 are inserted inside the U-shaped form of the optical sensors 311, so that the notches in the wafers can be respectively detected.

The diameter of the turntables 307 is slightly smaller than the diameter of the wafers 104 loaded thereon and, by having the support pins 310 sticking out in the radial direction from the outer circumferential parts of the turntables 307 and holding the wafers 104 so that the outer circumferential parts 104b of the wafers 104 protrude beyond the outer circumferential parts of the turntables 307, provision is made so that the turntables 307 and optical sensors 311 do not interfere with each other. Therefore the wafers 104 can be turned without restriction, and the notch positioning performed easily and quickly.

At the outer peripheries of the turntables 307 stacked in 5 stages are erected three lifting-up poles 321, deployed so that they can rise and descend freely. The direction of their erection is parallel to the turning axis of the turntables 307. In the lifting-up poles 321 are deployed lifting-up support pins 322, sticking out in an arm shape toward the center of turning, for supporting the outer circumferential parts of the wafers, at a constant pitch in the length direction. In FIG. 13, the lifting-up support pins 322 are diagrammed in a case where they underlie the support pins 310 deployed in the turntables 307. The support pins 310 and the lifting-up support pins 322 are configured so that they support the tapered surface of the wafers.

The three lifting-up poles 321 pass through the shelves 301 to 305, and are attached integrally to a base 323 that is deployed in a space formed between the bottom of the lowest stage shelf 305 and a lower plate 306. The base 323 is made so that it can be raised and lowered by an air cylinder 324. The lifting-up poles 321 merely rise and descend, and neither revolve nor advance or retract. Provision is made so that, by the rising of these lifting-up poles 321, the lifting-up support pins 322 engage the outer circumferential parts of the substrates so that the wafers are lifted up from the substrates support pins 310. Provision is also made so that the lifted-up wafers are returned to the substrates support pins 310 by the descending of the lifting-up poles 321.

Figure 14:
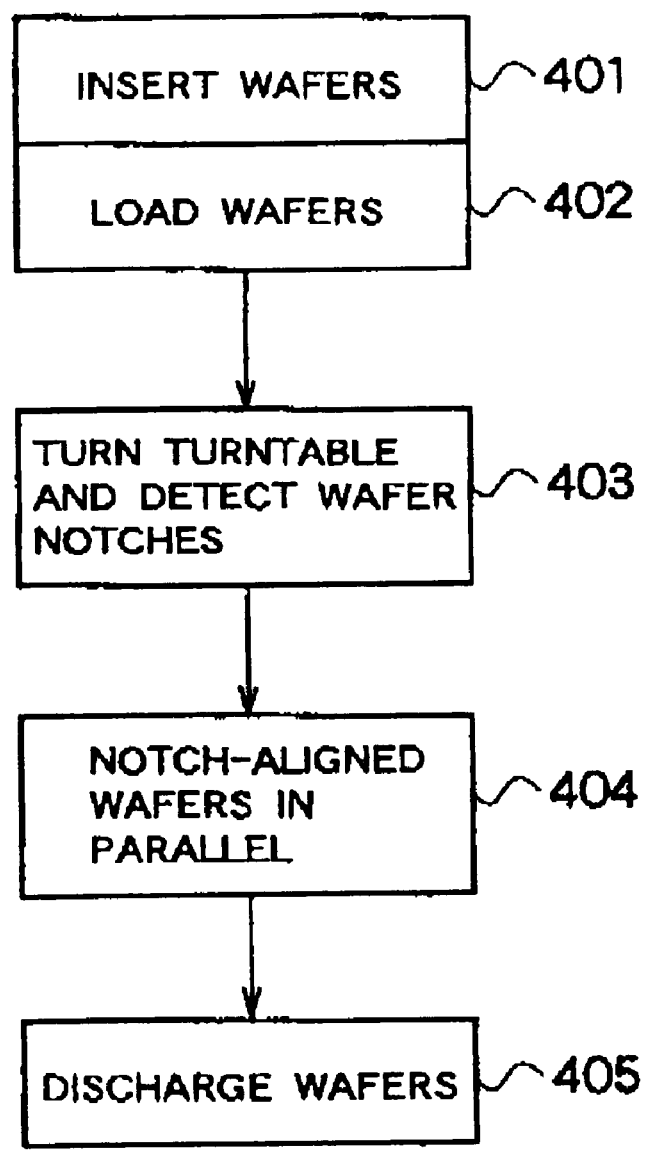
FIG. 14 is a flowchart of operation procedures of a type 1 five-substrate substrate alignment apparatus.

The operating sequence of a 5-wafer-single-batch substrate alignment apparatus having the configuration described in the foregoing is described next using the flow diagrammed in FIG. 14.

Five wafers are inserted into the notch alignment apparatus 30A with the 5-wafer-single-batch substrate transfer apparatus 1, and loaded onto the support pins 310 of the turntables 307 (steps 401 and 402). The turntables 307 are turned independently, the notches are detected by the optical sensors 311 (step 403), and the notches are aligned in prescribed positions (step 404). When the notch alignment of the turntables 307 in all five stages is finished, the wafers are carried out from the substrate alignment apparatus by the substrate transfer apparatus 1.

When the support pins 310 coincide with the notch positions, the support pins 310 block the light paths of the optical sensors 311 so that the notch position can no longer be detected. Also, there are times when, because the turntables 307 have been turned for the purpose of notch alignment, the positions of the support pins 310 will be shifted, and the support pins 310 will come to the position of the advance of the tweezers of the substrate transfer apparatus 1 so as to block that advance in cases where the support pins 310 block the light paths of the optical sensors 311, superimposition with the support pins 310 can be prevented by momentarily lifting up the wafers and causing them to withdraw with the lifting-up poles 321, shifting only the turntables 307 during that time, and reloading the wafers onto the shifted turntables 307. Also, taking into consideration cases where, after positioning, the support pins 310 block the advance of the tweezers, the path of advance of the tweezers can be opened by, similarly, after notch alignment, momentarily lifting up the wafers causing them to withdraw, and shifting only the turntables 307.

Thus the type 1 apparatus is one that supports the outer circumferential parts of wafers by support pins 310 deployed in the turntables 307, turns the wafers, detects notches in the wafers without making contact therewith, and aligns them. The motors 309 that turn the turntables 307 are deployed separately for each turntable 307, and activate them independently, wherefore, when a notch position is out of alignment, that can be dealt with to effect alignment individually, without interfering with the other wafers. Accordingly, there is no restriction on turning, and, because of the single-batch alignment, the speed of notch position detection is very fast.

The type 1 apparatus, furthermore, has two notch alignment apparatuses of a type that turn turntables individually deployed above and below, wafers are supplied alternately to the upper stage and lower stage notch alignment apparatuses, notch alignment is done alternately, and wafers for which notch alignment has been finished are alternately removed by the substrate transfer apparatus and successively transferred in the boat, thereby implementing notch alignment and wafer transfer. Accordingly, there is no need to continually be stopping the substrate transfer apparatus while effecting notch alignment as conventionally. Also, because the two notch alignment apparatuses are stacked vertically, the footprint can be kept small.

Type 2 configuration and operation (FIGS. 15 to 19):

This is an example that is configured of a single upright notch alignment apparatus, wherewith the notches of 10 wafers in a horizontally placed condition can be detected in a single batch with a single motor, wherein the positioning detection unit is divided into two (upper and lower) dependent regions, and those two regions are used alternately.

Figure 16:
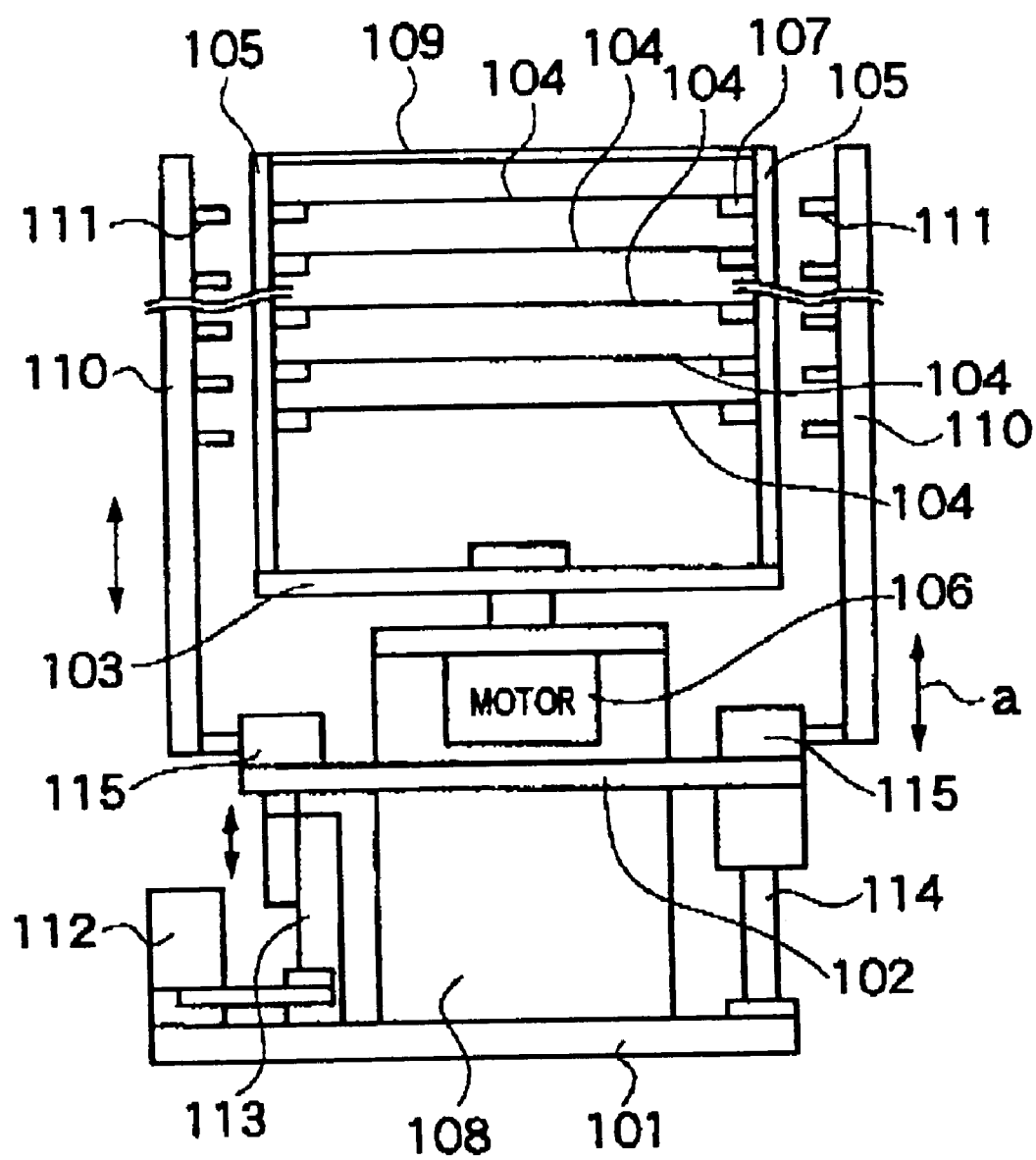
FIG. 16 is a front elevation of a type 2 substrate alignment apparatus.

FIG. 15 is a diagonal view of a type 2 substrate alignment apparatus, while FIG. 16 is a front elevation thereof. The notch alignment apparatus 40 comprises a pedestal 101, a ring-shaped base 102 deployed above the pedestal 101 so that it can freely rise and descend, and a turntable 103 that, while deployed above the ring-shaped base 102, can nevertheless turn freely on that pedestal 101.

A plural number of wafers 104 is supported from the bottom side of the outer circumferential parts 104b thereof by a plural number (3 in the example depicted in the figure) of support poles 105 erected about the periphery of the turntable 103 at prescribed angular intervals, and held at constant intervals in the vertical direction while in a flat-lying stacked condition.

The three support poles 105 are deployed in a dispersed manner, clustered in a roughly semicircular portion of the peripheral part of the turntable 103 that can be turned in reverse by a motor 106 functioning as a turning drive unit, the direction of erection whereof is parallel to the turning axis line of the turntable 103. In the support poles 105 are deployed support pins 107 that stick out like arms toward the inside in the radial direction of the turntable 103, which support pins 107 function as substrate support units for supporting the outer circumferential parts 104b of the wafers 104 from the bottom at a constant pitch in the length direction. Accordingly, provision is made so that the wafers 104 are turned by the turntable 103 while being supported as they are in the horizontally placed condition by the support poles 105. The turntable 103 is attached to the pedestal 101 by a support platform 108. The motor 106 for turning the turntable 103 is deployed inside the support platform 108.

The substrate supporting mechanism of the type 2 apparatus is configured mainly by the turntable 103, the support poles 105, the support pins 107, and the single motor 106.

Provision is made so that a plural number of the wafers 104 can be lifted up from the substrate support pins 107 by the rising of three lifting-up poles 110 deployed so that they can freely rise and descend (in the directions indicated by arrow a), one wafer at a time, in order, beginning from the wafer(s) 104 on which notch alignment has been completed. Provision is further made so that the lifted-up wafers 104 are returned to the substrate support pins 107 by the descending of the lifting-up poles 110. When this is being done, all that happens is that the lifting-up poles 110 rise and descend, and the base 102 supporting the lifting-up poles 110 does not turn, wherefore the angular position of the wafers 104 in the circumferential direction remains secured and does not move.

In the lifting-up poles 110 are deployed lifting-up support pins 111, sticking out in the shape of arms toward the center of turning, functioning as substrate latching units that lift up the wafers 104, supporting the outer circumferential parts 104b of the wafers 104, at a constant pitch in the length direction. These lifting-up support pins 111 are deployed in a plural number (which here is 10) corresponding to the number of wafers 104, at equal intervals, as diagrammed in the drawing. The three lifting-up poles 110 are deployed in a dispersed manner at intervals of roughly 120° about the periphery of the base 102 that moves so as to rise and descend by a slide mechanism 113 and a motor 112 attached to the pedestal 101, the direction of erection whereof is parallel to the turning axis line of the turntable 103.

Provision is made so that the rising and descending movement is performed smoothly by a guide 114 deployed between the pedestal 101 and the base 102. The lifting-up poles 110, moreover, are deployed so that they can advance and retract freely in the radial direction (direction indicated by the arrow b) in an erect condition. These lifting-up poles 110 are made so that they withdraw and move out of the way when the wafers 104 are being turned so as not to interfere with the support poles 105, and so that they advance when lifting is being done so that the lifting-up support pins 111 reach the outer circumferential parts 104b of the substrates. Hence each of the lifting-up poles 110 is attached to a corresponding air cylinder 115 secured to the base 102.

The substrate withdrawal mechanism of the type 2 apparatus is mainly configured of the base 102, the lifting-up poles 110, the lifting-up support pins 111, the air cylinders 115, and the motor 112.

In the notch alignment apparatus 40 is erected a sensor pole 117 having optical sensors 116 for detecting the notches 104a in five wafers 104 supported on the substrate support pins 107. This sensor pole 117 is deployed so that it can freely advance and retract with a certain stroke in the axial direction (the direction indicated by the arrow c), in the same manner as the lifting-up poles 110. When detecting the notches 104a in the wafers 104, the sensor pole 117 advances, and the optical sensors 116 approach but do not touch the outer circumferential parts 104b of the substrates. When not detecting, the sensor pole 117 is withdrawn out of the way so that it does not interfere with the support poles 105.

The dynamic relationship between the support poles 105, the lifting-up poles 110, and the sensor pole 117 here is such that, although the support poles 105 can turn freely (to the extent that the lifting-up poles 110 retract and do not interfere with the support poles 105), they do not advance or retract, or rise or descend, whereas the lifting-up poles 110, although they do not turn, do advance and retract, and do rise and descend. The sensor pole 117 is made so that it is allowed only to advance and retract.

The positional interrelationships are such, moreover, that the support poles 105 and the lifting-up poles 110 are arranged in a concentric circular form, with the support poles 105 deployed at roughly 90°, 90°, and 180° intervals on the circumference of the outer peripheries of the wafers, while, contrariwise, the lifting-up poles 110 are deployed at equal intervals of roughly 120° on a circumference that is farther to the outside than the support poles 105. The interval between the two support poles 105 that are open 180° diagonally toward the front in the diagram in FIG. 15 constitutes the insertion/removal window for the wafers 104, with the large black arrow indicating the direction of advance and entry, the reverse whereof is the direction of wafer 104 removal. The sensor pole 117 is deployed exactly on the opposite side from the wafer 104 insertion/removal window, with the turning axis of the turntable 103 interposed therebetween. The sensor pole 117 is deployed on the opposite side so that it will not interfere with wafer insertion and removal. Five wafers 104 are loaded into the notch alignment apparatus 40 by the substrate transfer apparatus 1 (cf. FIGS. 1 and 2) in a horizontally placed condition, or, alternatively, removed thereby from the notch alignment apparatus 40.

Figure 17:
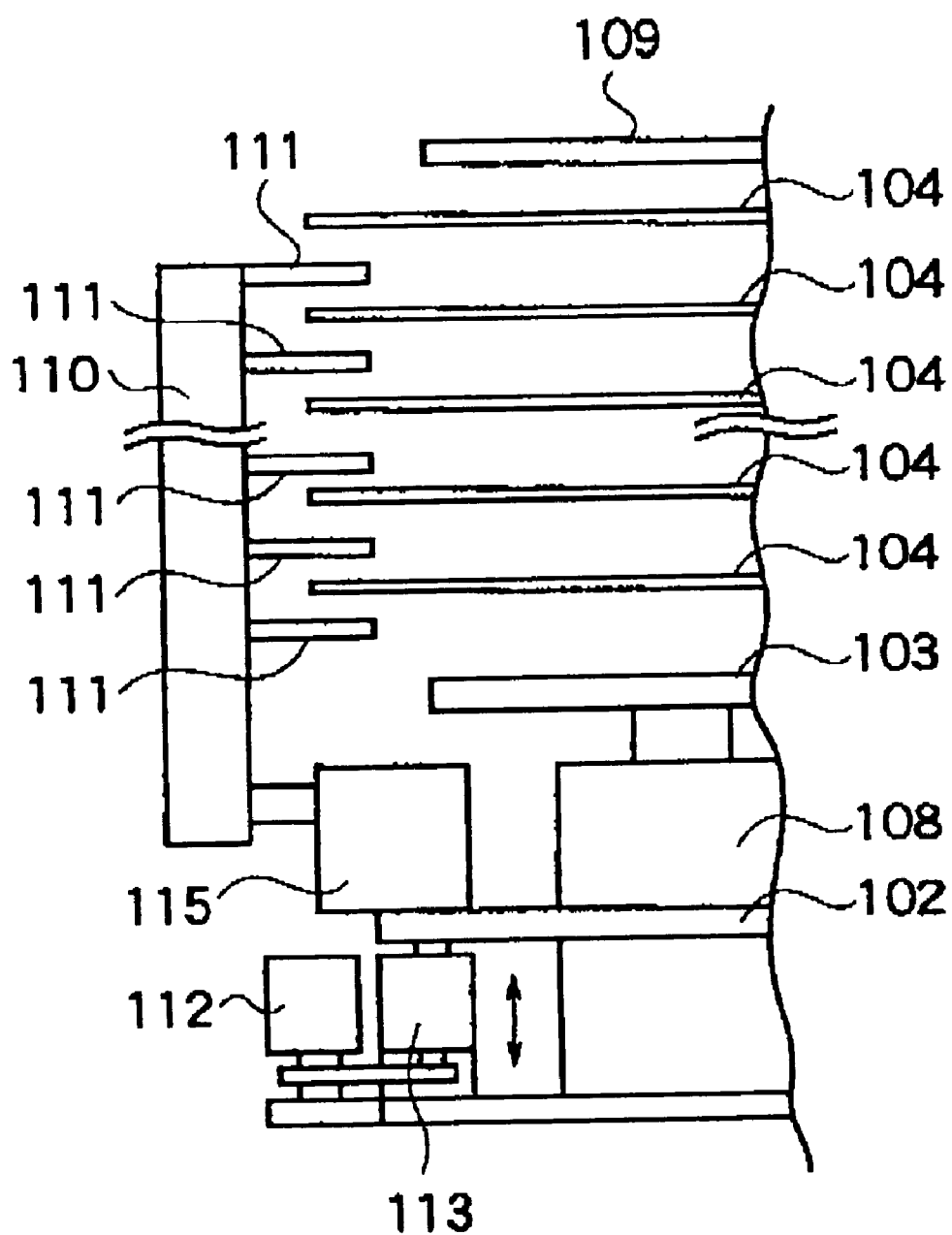
FIG. 17 is an explanatory diagram showing the relationship between a type 2 apparatus lift-up pole and wafers.
Figure 18A:
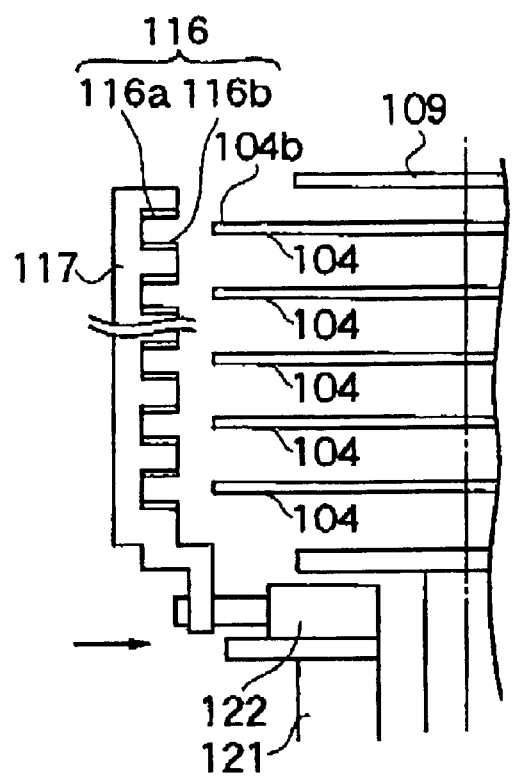
FIGS. 18A and 18B are explanatory diagrams showing the relationship between wafers and a sensor pole for detecting notches in a type 2 apparatus.
Figure 18B:
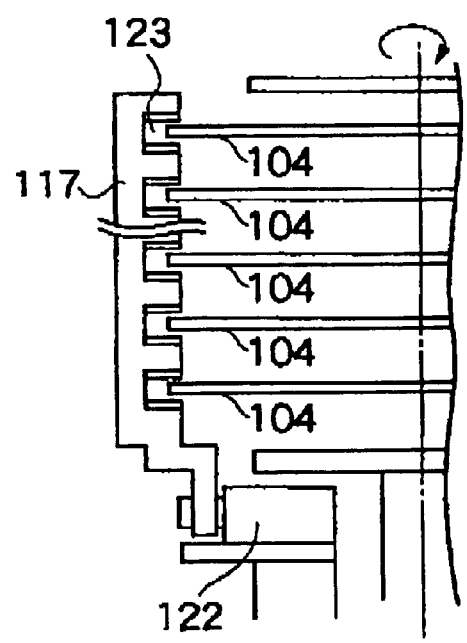

FIG. 17 diagrams the relationship between the lifting-up poles 110 and the wafers 104. In the condition diagrammed, the air cylinders 115 secured to the base 102 have been activated, and the lifting-up poles 110 advanced to the wafer 104 side (toward the inside in the radial direction). By raising the base 102 through the slide mechanism 113 by the motor 112, the lifting-up poles 110 are raised, wherefore the wafers 104 can be lifted up in the vertical direction by the lifting-up support pins 111.

In order to detect the notches, 5 wafers 104 are inserted in the notch alignment apparatus, and loaded onto the substrate support pins 107, after which, first, the support poles 105 are turned 180°, and the wafer 104 notch detection region (between the two support poles 105 open 180°) is made to approach close to the sensor pole 117. After that, the air cylinder 122 attached to the top of the support platform 121 secured to the pedestal 101 is activated, the sensor pole 117 that is in the withdrawn position (cf. FIG. 18A) is made to move in the direction of the arrow, and the optical sensors 116 are pushed in to the outer circumferential parts 104b of the wafers 104 (cf. FIG. 18B). When, in this condition, the wafers 104 are turned through precisely a certain angle, the outer circumferential parts 104b of the wafers 104 pass through gaps 123 between light emitting elements 116a and light receiving elements 116b, so the presence or absence of the notches can be detected. Provision is made so that the angular positions of notches can be detected by angle signals from a position detecting encoder for the motor 106. The angular position of the notch in each wafer 104 is stored in a memory device (not shown). After the angular positions of the notches have been detected, the sensor pole 117 is withdrawn out of the way (cf. FIG. 18A) prior to the lifting up action. This is done in order to avoid the conflict between the sensors and the wafers that occurs when the wafers are lifted up with the sensors in the inserted condition.

Next, the actions of the notch alignment apparatus having the configuration described in the foregoing are described with reference to FIGS. 19A,19B,19C and 19D. FIGS. 19A,19B,19C and 19D are explanatory diagrams relating to an operation wherewith, when 5 wafers are notch aligned in a single batch, the wafers 104 for which notch alignment has been finished (the hatched wafers in the diagram) are lifted up, successively, one at a time.

In FIG. 19A is diagrammed a condition wherein, after the notch of the lowest wafer 104 (indicated by hatching) among the 5 wafers 104 has been aligned, the lifting-up poles 110 are advanced in toward the inside in the axial direction of the wafers, and the lifting-up support pins 111 are made to slide beneath the outer circumferential parts 104b of the wafers 104. Then, as diagrammed in FIG. 19B, the lifting-up support pins 111 are made to rise by the slide mechanism 113, and the first wafer 104 for which notch alignment has been finished is raised up and removed from the substrate support pins 107 of the support poles 105.

Next, with the first wafer 104 from the bottom in a raised up condition, the support poles 105 are turned, and the notch 104a of the second wafer 104 from the bottom is aligned, based on detected angular position data. When that second notch alignment is finished, the second wafer 104 is lifted up by the lifting-up support pins 111, as diagrammed in FIG. 19C. In similar fashion, notch alignment and lifting up are repeated sequentially for the third, fourth, and fifth wafers. In FIG. 19D is diagrammed a condition wherein the last wafer 104 has been lifted up by the lifting-up support pins 111 of the lifting-up poles 110. In this manner, all of the wafers 104 are lifted up from the substrate support pins 107 and transferred onto the lifting-up support pins 111. When the operations described above are finished, the notches 104a of all of the wafers 104 will be lined up.

After the chain of actions described in the foregoing is finished, the three support poles 105 will have repeated the notch alignment action, and will therefore be shifted from the prescribed positions (that is, will not be in the positions they were in prior to notch detection). That being so, the turntable 103 is here turned and the support poles 105 are returned to their prescribed positions. Next, the lifting-up poles 110 are caused to descend, and all of the 5 wafers 104 are returned from the lifting-up support pins 111 to the substrate support pins 107 of the support poles 105. After that replacement, the lifting-up poles 110 are withdrawn away from the wafers 104. When, in this condition, the support poles 105 are turned 180°, the support poles 105 return to the original starting position. Thereupon, 5 wafers 104 are removed in a single batch from the notch alignment apparatus 40 by the substrate transfer apparatus.

Thus the type 2 apparatus is configured of support poles and lifting-up poles, in a configuration that makes it possible to load 10 wafers and raise up 10 wafers. In this apparatus, as in the case of the type 1 apparatus, the first 5 wafers are placed in the upper stage region 40A of the support poles and notch alignment is performed. After that upper notch alignment has been finished, the next 5 wafers removed beforehand by the transfer device are transferred into the lower stage region 40B of the support poles, and notch alignment is performed. The 5 wafers on which the notch alignment in the upper stage region 40A has been finished are removed by the substrate transfer apparatus prior to performing notch alignment in the lower stage region 40B, and transferred into the boat. In the case of the type 2 notch alignment apparatus, while notch alignment is being performed on the upper stage or lower stage wafers, the wafers in one region or the other on which notch alignment has already been finished are transferred into the boat, or, alternatively, a transporting operation to one or other of the regions is performed. Accordingly, the wafer transfer time is shortened. With the type 2 apparatus, furthermore, structurally speaking, only one motor is needed in the drive mechanism for the substrate alignment apparatus, wherefore the drive mechanism can be made simpler and the apparatus cost reduced.

With the embodiments described in the foregoing, moreover, the operation is implemented from the upper stage of the notch alignment apparatus to the lower stage thereof, but it may instead be advanced from the lower stage to the upper stage. Also, the substrate alignment apparatus is made a two-stage (upper and lower stage) apparatus, but the stages may be placed side by side. Also, even if three or more alignment apparatuses are used, the positioning regions may be made in three or more stages.

Furthermore, in the embodiment aspects, the number of wafers processed by the notch alignment apparatus and the number of wafers transferred by the transfer device are made the same, but they may instead be made different.

If examples of actual transfer times and notch alignment times are to be cited, for reference, the time for transferring wafers to and into the notch alignment apparatus is 6 seconds or so, the time for moving wafers from the notch alignment apparatus and loading them into the boat is 6 seconds or so, and the notch alignment time for 5 wafers is approximately 19 seconds with the type 1 apparatus and 35 seconds with the type 2 apparatus.

The present invention can also be applied even if a plural number of the substrate alignment apparatuses diagrammed in FIG. 13 and FIG. 15 are deployed. The present invention, which presupposes being able to have only one substrate transfer apparatus, is very effective in single boat cases where, during wafer processing, it is not possible to perform notch alignment on the next wafers to be processed or to transfer them into the boat. In a double boat case, on the other hand, during water processing, the next wafers to be processed can be notch aligned and/or transferred into a boat, wherefore the present invention will appear to be ineffective. To be sure, in the double boat case, that may be true of the second and following batches. However, there is nevertheless the merit of being able to adequately shorten the transfer time in the first batch. Furthermore, the problems when there is but one substrate transfer apparatus can be resolved by providing two substrate transfer apparatuses, but, in that case, such shortcomings as higher costs and larger equipment width (footprint) are encountered, making it impractical.

Based on the present invention, provision is made so that notch or orientation flat alignment and substrate transporting are performed in parallel, wherefore substrate transfer apparatus wait time is decreased, the operating rate is raised, and substrate processing throughput is improved.

What is claimed is:
1. A substrate processing method, comprising:

providing a single substrate transfer apparatus and a substrate alignment apparatus, said substrate transfer apparatus being either for transporting at one time a plural number of substrates prior to notch or orientation flat alignment from a substrate accommodating container to said substrate alignment apparatus, or for transporting a plural number of substrates on which notch or orientation flat alignment has been performed from said substrate alignment apparatus to a boat, said substrate alignment apparatus being capable of performing notch or orientation flat alignment on a number of substrates that is twice or more of said number of substrates which said substrate transfer apparatus transports at one time; and setting a number of substrates on which notch or orientation flat alignment is performed at one time with said substrate alignment apparatus to said number of substrates which said substrate transfer apparatus transports at one time;

said method being designed so as to perform, in parallel:
    said notch or orientation flat alignment on substrates with said substrate alignment apparatus wherein said number of substrates on which said notch or orientation flat alignment is performed at one time is set in such a way; and
    either said transporting of substrates by said single substrate transfer apparatus prior to said notch or orientation flat alignment from said substrate accommodating container to said substrate alignment apparatus, or said transporting of substrates on which said notch or orientation flat alignment has been performed from said substrate alignment apparatus to said boat.

2. A substrate processing method, comprising:

providing a single substrate transfer apparatus and a plural number of independently operating substrate alignment units, said substrate transfer apparatus being either for transferring at one time a plural number of substrates prior to notch or orientation flat alignment, from a substrate accommodating container to said substrate alignment units, or for transferring a plural number of substrates on which notch or orientation flat alignment has been performed from said substrate alignment units to a boat, said substrate alignment units being capable of performing notch or orientation flat alignment, in total, on a number of substrates that is twice or more of said number of substrates which said substrate transfer apparatus transfers at one time;

said method being designed such that, in parallel with performing said notch or orientation flat alignment on said substrates with one of said substrate alignment units, using said substrate transfer apparatus, substrates prior to notch or orientation flat alignment are transferred from said substrate accommodating container to other unit or units of said substrate alignment units, or substrates on which notch or orientation flat alignment has been performed with other unit or units of said substrate alignment units are transferred from said other unit or units of said substrate alignment units to said boat.

3. The substrate processing method according to claim 2, wherein, using said substrate transfer apparatus, after substrates on which notch or orientation flat alignment has been performed with said other unit or units of said substrate alignment units are transferred from said other unit or units of said substrate alignment units to said boat, substrates prior to notch or orientation flat alignment are transferred from said substrate accommodating container to said other unit or units of said substrate alignment units.

4. The substrate processing method according to claim 2, wherein, said notch or orientation flat alignment action done by said one of said substrate alignment units and said notch or orientation flat alignment action done by said other unit or units are performed while being allowed to partially overlap.

5. A substrate processing method, comprising:

providing a single substrate transfer apparatus and a substrate alignment apparatus, said substrate transfer apparatus being for transporting at one time a plural number of substrates either from a substrate accommodating container to said substrate alignment apparatus or from said substrate alignment apparatus to a boat, said substrate alignment apparatus having a plurality of dependently operating regions being capable of performing notch or orientation flat alignment, in total, on a number of substrates that is twice or more of said number of substrates which said substrate transfer apparatus transports at one time;

said method being designed such that, in parallel with performing said notch or orientation flat alignment on substrates with one of said plurality of regions, using said substrate transfer apparatus, substrates prior to notch or orientation flat alignment are transferred from said substrate accommodating container to other region of said regions, or substrates, discharged from said other region, on which notch or orientation flat alignment has been performed by said other region are transferred to said boat.

6. The substrate processing method according to claim 5, wherein, using said substrate transfer apparatus, after substrates, discharged from said other region, on which notch or orientation flat alignment has been performed by said other region are transported from said other region to said boat, substrates prior to notch or orientation flat alignment are transported from said substrate accommodating container to said other region.

7. The substrate processing method according to claim 5, wherein said transporting of substrates prior to notch or orientation flat alignment from said substrate accommodating container to said other region by said substrate transfer apparatus is performed by taking out substrates prior to notch or orientation flat alignment from said substrate accommodating container and transporting these substrates to vicinity of said other region; and said method is designed such that, after notch or orientation flat alignment of substrates in said one region, said substrates taken out from said substrate accommodating container and transported to the vicinity of said other region are loaded into said other region.

8. A substrate processing method, comprising:

providing a single substrate transfer apparatus and a substrate alignment apparatus, said substrate transfer apparatus being for transferring at one time a plural number of substrates either from a substrate accommodating container to said substrate alignment apparatus or from said substrate alignment apparatus to a boat, said substrate alignment apparatus having a plurality of dependently operating regions being capable of performing notch or orientation flat alignment, in total, on a number of substrates that is twice or more of said number of substrates which said substrate transfer apparatus transports at one time;

taking out substrates prior to notch or orientation flat alignment by said substrate transfer apparatus from said substrate accommodating container and loading these substrates into one region of said plurality of regions of said substrate alignment apparatus;

performing notch or orientation flat alignment on said substrates by said one region of said substrate alignment apparatus;

taking out substrates prier to next notch or orientation flat alignment from said substrate accommodating container by said substrate transfer apparatus during notch or orientation flat alignment in said one region;

after completing said notch or orientation flat alignment of said substrates in said one regions, loading said substrates, which have been taken out for a next notch or orientation flat alignment, into other region of said plurality of regions;

after loading said substrates into said other region, taking out said substrates, on which notch or orientation flat alignment has been performed in said one region, from said one region;

after taking out said substrates from said one regions, performing notch or orientation flat alignment on said substrates by said other region; and transporting said substrates taken out from said one region to said boat, during notch or orientation flat alignment in said other region.

* * * * *